(12) United States Patent
Yamaguchi et al.

(10) Patent No.: US 8,258,048 B2
(45) Date of Patent: *Sep. 4, 2012

(54) SEMICONDUCTOR LASER DEVICE AND METHOD OF FABRICATING THE SAME

(75) Inventors: Tsutomu Yamaguchi, Nara (JP); Masayuki Hata, Kadoma (JP); Takashi Kano, Hirakata (JP); Masayuki Shono, Hirakata (JP); Hiroki Ohbo, Moriguchi (JP); Yasuhiko Nomura, Moriguchi (JP); Hiroaki Izu, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/492,517

(22) Filed: Jun. 26, 2009

(65) Prior Publication Data

US 2009/0262772 A1 Oct. 22, 2009

Related U.S. Application Data

(62) Division of application No. 11/393,891, filed on Mar. 31, 2006, now Pat. No. 7,567,605.

(30) Foreign Application Priority Data

Mar. 31, 2005 (JP) .................. 2005-103049

(51) Int. Cl.
*H01L 21/20* (2006.01)

(52) U.S. Cl. ............. 438/483; 438/31; 372/46.016; 372/43.01

(58) Field of Classification Search ............. 372/43.01, 372/46.016; 438/483
See application file for complete search history.

(56) References Cited

U.S. PATENT DOCUMENTS

| 4,092,614 A | | 5/1978 | Sakuma et al. | |
|---|---|---|---|---|
| 4,383,320 A | | 5/1983 | Botez et al. | |
| 4,432,091 A | * | 2/1984 | Kuroda et al. | 372/45.01 |
| 4,433,417 A | * | 2/1984 | Burnham et al. | 372/45.01 |
| 4,845,724 A | | 7/1989 | Hayakawa et al. | |
| 4,894,836 A | | 1/1990 | Hayakawa et al. | |
| 5,892,785 A | * | 4/1999 | Nagai | 372/46.013 |

(Continued)

FOREIGN PATENT DOCUMENTS

JP  2000-022212  1/2000

(Continued)

OTHER PUBLICATIONS

Japanese Office Action, with English translation, issued in Japanese Patent Application No. 2005-103049, mailed Jan. 26, 2010.

*Primary Examiner* — Jessica Stultz
*Assistant Examiner* — Xinning Niu
(74) *Attorney, Agent, or Firm* — McDermott Will & Emery LLP

(57) ABSTRACT

A semiconductor laser device capable of reducing the threshold current and improving luminous efficiency and a method of fabricating the same are obtained. This semiconductor laser device comprises a semiconductor substrate having a principal surface and a semiconductor element layer, formed on the principal surface of the semiconductor substrate, having a principal surface substantially inclined with respect to the principal surface of the semiconductor substrate and including an emission layer.

13 Claims, 22 Drawing Sheets

U.S. PATENT DOCUMENTS

| | | |
|---|---|---|
| 6,413,627 B1 | 7/2002 | Motoki et al. |
| 6,924,159 B2 | 8/2005 | Usui et al. |
| 7,462,882 B2 | 12/2008 | Ueta et al. |
| 7,567,605 B2 * | 7/2009 | Yamaguchi et al. ........ 372/45.01 |
| 2002/0105986 A1 * | 8/2002 | Yamasaki ........................ 372/45 |
| 2004/0013149 A1 * | 1/2004 | Hanaoka ......................... 372/46 |
| 2005/0141577 A1 * | 6/2005 | Ueta et al. ....................... 372/43 |

FOREIGN PATENT DOCUMENTS

| | | |
|---|---|---|
| JP | 2000-183460 | 6/2000 |
| JP | 2003-178984 | 6/2003 |
| JP | 2004-327655 | 11/2004 |

* cited by examiner

SEMICONDUCTOR LASER DEVICE AND METHOD OF FABRICATING THE SAME

RELATED APPLICATIONS

This application is a divisional of U.S. application Ser. No. 11/393,891, filed Mar. 31, 2006, now U.S. Pat. No. 7,567,605 claiming priority of Japanese Application No. 2005-103049, filed Mar. 31, 2005, the entire contents of each of which are hereby incorporated by reference.

BACKGROUND OF THE INVENTION

1. Field of the Invention

The present invention relates to a semiconductor laser device and a method of fabricating the same, and more particularly, it relates to a semiconductor laser device including a semiconductor element layer having an emission layer and a method of fabricating the same.

2. Description of the Background Art

A semiconductor laser device including a semiconductor element layer having an emission layer is known in general, as disclosed in Japanese Patent Laying-Open No. 2004-327655, for example. The aforementioned Japanese Patent Laying-Open No. 2004-327655 discloses a nitride semiconductor laser device prepared by growing a nitride semiconductor layer (semiconductor element layer) including an emission layer on the surface (principal surface) of a nitride semiconductor substrate having a dislocation concentration region and a low dislocation region in a state inclined by 0.3° to 0.7° with respect to the crystal orientation of the nitride semiconductor substrate. In this semiconductor laser device, the nitride semiconductor layer is grown in the state inclined by 0.3° to 0.7° with respect to the crystal orientation of the nitride semiconductor substrate so that the surface of the nitride semiconductor layer is parallel (planar) to the surface of the nitride semiconductor substrate, whereby dislocations (defects) in the nitride semiconductor layer propagate perpendicularly to the surface of the nitride semiconductor substrate. In the process of growing the nitride semiconductor layer, therefore, dislocations in a portion of the nitride semiconductor layer located immediately above the dislocation concentration region of the nitride semiconductor substrate can be inhibited from propagation into another portion of the nitride semiconductor layer located immediately above the low dislocation region of the nitride semiconductor substrate. Consequently, the number of dislocations can be inhibited from increase in the portion of the nitride semiconductor layer located immediately above the low dislocation region of the nitride semiconductor substrate.

In the nitride semiconductor laser device according to the aforementioned Japanese Patent Laying-Open No. 2004-327655, however, dislocations of the nitride semiconductor layer propagate perpendicularly to the surface of the nitride semiconductor substrate, whereby dislocations of the low dislocation region of the nitride semiconductor substrate also propagate toward the surface of the portion of the nitride semiconductor layer grown immediately above the low dislocation region. Therefore, it is difficult to further reduce the number of dislocations on the surface of the nitride semiconductor layer, and hence it is also difficult to further reduce the number of dislocations in the nitride semiconductor layer including the emission layer. Thus, light absorption by dislocations is so hard to reduce that it is difficult to further improve the luminous efficiency. Further, it is difficult to further reduce the number of nonradiative centers formed in the emission layer since it is difficult to further reduce the number of dislocations in the emission layer as described above. The nonradiative centers, which are levels where carriers recombine without emitting light, formed in the emission layer increase the threshold current. Thus, it is difficult to further reduce the threshold current.

SUMMARY OF THE INVENTION

The present invention has been proposed in order to solve the aforementioned problems, and an object of the present invention is to provide a semiconductor laser device capable of reducing the threshold current and improving luminous efficiency and a method of fabricating the same.

In order to attain the aforementioned object, a semiconductor laser device according to a first aspect of the present invention comprises a semiconductor substrate having a principal surface, a semiconductor element layer, formed on the principal surface of the semiconductor substrate, having a principal surface substantially inclined with respect to the principal surface of the semiconductor substrate and including an emission layer and a growth inhibiting portion arranged on a prescribed region of the principal surface of the semiconductor substrate, and the growth inhibiting portion includes a defect concentration region.

In the semiconductor laser device according to the first aspect, as hereinabove described, the semiconductor element layer having the principal surface substantially inclined with respect to the principal surface of the semiconductor substrate and including the emission layer is so provided that the same can be grown with the principal surface inclined with respect to the principal surface of the semiconductor substrate, whereby the semiconductor element layer can be grown not only in a direction perpendicular to the principal surface of the semiconductor substrate but also in a direction (horizontal direction) parallel thereto. When defects (dislocations) propagated from the principal surface of the semiconductor substrate following growth of the semiconductor element layer grow on the semiconductor element layer, therefore, the defects of the semiconductor layer can be propagated not only in the direction perpendicular to the principal surface of the semiconductor substrate but also in the direction (horizontal direction) parallel thereto, whereby the defects can be further inhibited from propagation to the principal surface of the semiconductor element layer as compared with a case where the defects of the semiconductor element layer are propagated only in the direction perpendicular to the principal surface of the semiconductor substrate. Thus, formation of defects on the principal surface of the semiconductor element layer can be further suppressed, whereby light absorption by defects can be further suppressed. Consequently, luminous efficiency can be further improved. Further, formation of defects on the principal surface of the semiconductor element layer can be further suppressed as described above, whereby the number of nonradiative centers formed in the emission layer can be further reduced. Consequently, the threshold current can be further reduced.

In addition, the growth inhibiting portion arranged on the prescribed region of the principal surface of the semiconductor substrate is so provided that the growth inhibiting portion can be prevented from deposition of film forming species in growth of the semiconductor element layer, whereby the concentration of film forming species can be increased in a portion of the semiconductor element layer close to the growth inhibiting portion. Thus, the film forming species can so easily deposit on the portion of the semiconductor element layer close to the growth inhibiting portion that this portion can be rendered easier to grow as compared with the remaining portion of the semiconductor element layer. Consequently, the portion of the semiconductor element layer close to the growth inhibiting portion and the remaining portion thereof can be formed with different thicknesses, whereby the semiconductor element layer having the principal surface substantially inclined with respect to the principal surface of the semiconductor substrate can be easily formed. Further, the growth inhibiting portion is so formed by the defect concentration region provided on the prescribed region of the principal surface of the semiconductor substrate that the semiconductor substrate previously formed with the defect concentration region may simply be employed without separately forming a growth inhibiting portion on the principal surface of the semiconductor substrate, whereby the fabrication process can be simplified.

In the aforementioned semiconductor laser device according to the first aspect, the surface of the defect concentration region is preferably terminated with nitrogen. According to this structure, the surface of the growth inhibiting portion including the defect concentration region can be easily prevented from deposition of film forming species.

In the aforementioned semiconductor laser device according to the first aspect, the growth inhibiting portion is preferably so provided as to extend along the <1-100> direction of the semiconductor substrate. According to this structure, a growth component of the semiconductor element layer in the direction (horizontal direction) parallel to the principal surface of the semiconductor substrate can be enlarged as compared with a case of providing the growth inhibiting portion to extend in a direction along the <11-20> direction of the semiconductor substrate, for example, whereby a defect propagation component in the direction (horizontal direction) parallel to the principal surface of the semiconductor substrate can be enlarged. Thus, the defects can be further effectively inhibited from propagation to the principal surface of the semiconductor element layer, whereby formation of defects on the principal surface of the semiconductor element layer can be further effectively suppressed.

In the aforementioned semiconductor laser device according to the first aspect, the growth inhibiting portion preferably includes a first growth inhibiting portion and a second growth inhibiting portion arranged on the principal surface of the semiconductor substrate at a prescribed interval, and the semiconductor element layer is preferably formed between the first growth inhibiting portion and the second growth inhibiting portion while the principal surface of the semiconductor element layer is preferably concaved. According to this structure, defects of the semiconductor element layer can be easily propagated not only in the direction perpendicular to the principal surface of the semiconductor substrate but also in the direction (horizontal direction) parallel thereto in growth of the semiconductor element layer having the concave principal surface, whereby propagation of defects to the principal surface of the semiconductor element layer can be further suppressed as compared with a case where the defects of the semiconductor element layer are propagated only in the direction perpendicular to the principal surface of the semiconductor substrate.

The aforementioned semiconductor laser device provided with the semiconductor element layer having the concave principal surface preferably further comprises a first electrode formed on the principal surface of the semiconductor element layer and a second electrode formed on the back surface of the semiconductor substrate, so that the first electrode of the semiconductor laser device is mounted on a base. According to this structure, a structure including the semiconductor element layer having a projection portion, functioning as a current path toward the emission layer, provided inside the concave principal surface of the semiconductor element layer is mounted on the base from the side of the first electrode formed on the semiconductor element layer, whereby the projection portion located inside the concave principal surface can be prevented from application of an impact when the semiconductor laser device is mounted on the base.

The aforementioned semiconductor laser device provided with the semiconductor element layer having the concave principal surface preferably further comprises a projection portion functioning as a current path toward the emission layer, and the projection portion is preferably formed on an inclined region of the principal surface of the semiconductor element layer. According to this structure, the projection portion can be easily formed on an inclined plane of the concave principal surface of the semiconductor element layer.

The aforementioned semiconductor laser device having the projection portion formed on the inclined region of the principal surface of the semiconductor element layer preferably further comprises a first electrode formed on the principal surface of the semiconductor element layer and a second electrode formed on the back surface of the semiconductor substrate, so that the second electrode of the semiconductor laser device is mounted on a base. According to this structure, wire bonding can be performed on the central portion of the upper surface of the first electrode formed on the principal surface of the semiconductor element layer while suppressing wire bonding on a portion of the first electrode located above the projection portion formed on the inclined region of the semiconductor element layer in the state where the second electrode is mounted on the base. Thus, no wire bonding may be performed on an end of the surface of the first electrode in order to prevent wire bonding on the portion of the first electrode located above the projection portion, whereby the end of the surface of the first electrode can be prevented from chipping resulting from wire bonding.

The aforementioned semiconductor laser device provided with the semiconductor element layer having the concave principal surface preferably further comprises a projection portion functioning as a current path toward the emission layer, and the top of the projection portion is preferably formed on a position lower than the top of the semiconductor element layer. According to this structure, the projection portion can be so arranged inside the concave principal surface of the semiconductor element layer that the same can be further prevented from application of an impact when the semiconductor laser device is mounted on the base or the like.

In the aforementioned semiconductor laser device according to the first aspect, the misoriented angle of the semiconductor substrate toward the <1-100> direction is preferably at least −0.25° and not more than 0.25°. According to this structure, the inclination of the principal surface of the semiconductor element layer can be increased with respect to the principal surface of the semiconductor substrate, whereby the defect propagation component in the direction (horizontal direction) parallel to the principal surface of the semiconductor substrate can be enlarged in growth of the semiconductor element layer. Thus, the defects can be further effectively inhibited from propagation to the principal surface of the semiconductor element layer, whereby formation of defects on the principal surface of the semiconductor element layer can be further suppressed.

In the aforementioned semiconductor laser device according to the first aspect, the misoriented angle of the semiconductor substrate toward the <11-20> direction is preferably not more than −0.05° or at least 0.05°. According to this structure, the inclination of the principal surface of the semiconductor layer can be increased with respect to the principal surface of the semiconductor substrate, whereby the principal surface of the semiconductor element layer can be inhibited from nonuniform formation of protuberances in growth of the semiconductor element layer. Thus, the emission layer can be inhibited from uneven formation along protuberances of the semiconductor element layer, whereby light in the emission layer can be inhibited from outgoing from the upper and lower surfaces of the emission layer without rectilinear propagation. Consequently, a light confinement effect can be so improved as to improve luminous efficiency.

A semiconductor laser device according to a second aspect of the present invention comprises a semiconductor substrate having a principal surface, a semiconductor element layer, formed on the principal surface of the semiconductor substrate, having a principal surface substantially inclined with respect to the principal surface of the semiconductor substrate and including an emission layer and a growth inhibiting portion arranged on a prescribed region of the principal surface of the semiconductor substrate, and the surface of the growth inhibiting portion is terminated with nitrogen.

In the semiconductor laser device according to the second aspect, as hereinabove described, the semiconductor element layer having the principal surface substantially inclined with respect to the principal surface of the semiconductor substrate and including the emission layer is so provided that the same can be grown with the principal surface inclined with respect to the principal surface of the semiconductor substrate, whereby the semiconductor element layer can be grown not only in a direction perpendicular to the principal surface of the semiconductor substrate but also in a direction (horizontal direction) parallel thereto. When defects (dislocations) propagated from the principal surface of the semiconductor substrate following growth of the semiconductor element layer grow on the semiconductor element layer, therefore, the defects of the semiconductor layer can be propagated not only in the direction perpendicular to the principal surface of the semiconductor substrate but also in the direction (horizontal direction) parallel thereto, whereby the defects can be further inhibited from propagation to the principal surface of the semiconductor element layer as compared with a case where the defects of the semiconductor element layer are propagated only in the direction perpendicular to the principal surface of the semiconductor substrate. Thus, formation of defects on the principal surface of the semiconductor element layer can be further suppressed, whereby light absorption by defects can be further suppressed. Consequently, luminous efficiency can be further improved. Further, formation of defects on the principal surface of the semiconductor element layer can be further suppressed as described above, whereby the number of nonradiative centers formed in the emission layer can be further reduced. Consequently, the threshold current can be further reduced.

In addition, the growth inhibiting portion arranged on the prescribed region of the principal surface of the semiconductor substrate is so provided that the growth inhibiting portion can be prevented from deposition of film forming species in growth of the semiconductor element layer, whereby the concentration of film forming species can be increased in a portion of the semiconductor element layer close to the growth inhibiting portion. Thus, the film forming species can so easily deposit on the portion of the semiconductor element layer close to the growth inhibiting portion that this portion can be rendered easier to grow as compared with the remaining portion of the semiconductor element layer. Consequently, the portion of the semiconductor element layer close to the growth inhibiting portion and the remaining portion thereof can be formed with different thicknesses, whereby the semiconductor element layer having the principal surface substantially inclined with respect to the principal surface of the semiconductor substrate can be easily formed. Further, the surface of the growth inhibiting portion is so terminated with nitrogen that the surface of the growth inhibiting portion can be easily prevented from deposition of film forming species.

A method of fabricating a semiconductor laser device according to a third aspect of the present invention comprises steps of preparing a semiconductor substrate provided with at least either a growth inhibiting portion including a defect concentration region or a growth promoting portion on a prescribed region of the principal surface and growing a semiconductor element layer having a principal surface substantially inclined with respect to the principal surface of the semiconductor substrate and including an emission layer on the principal surface of the semiconductor substrate through at least either the growth inhibiting portion or the growth promoting portion.

In the method of fabricating a semiconductor laser device according to the third aspect, as hereinabove described, the semiconductor element layer having the principal surface substantially inclined with respect to the principal surface of the semiconductor substrate and including the emission layer is so formed on the principal surface of the semiconductor substrate through at least either the growth inhibiting portion or the growth promoting portion that the semiconductor element layer can be grown with the principal surface inclined with respect to the principal surface of the semiconductor substrate, whereby the semiconductor element layer can be grown not only in a direction perpendicular to the principal surface of the semiconductor substrate but also in a direction (horizontal direction) parallel thereto. When defects propagated from the principal surface of the semiconductor substrate following growth of the semiconductor element layer grow on the semiconductor element layer, therefore, the defects of the semiconductor layer can be propagated not only in the direction perpendicular to the principal surface of the semiconductor substrate but also in the direction (horizontal direction) parallel thereto, whereby the defects can be further inhibited from propagation to the principal surface of the semiconductor element layer as compared with a case where the defects of the semiconductor element layer are propagated only in the direction perpendicular to the principal surface of the semiconductor substrate. Thus, formation of defects on the principal surface of the semiconductor element layer can be further suppressed, whereby light absorption by defects can be further suppressed. Consequently, luminous efficiency can be further improved. Further, formation of defects on the principal surface of the semiconductor element layer can be further suppressed as described above, whereby the number of nonradiative centers formed in the emission layer can be further reduced. Consequently, the threshold current can be further reduced.

In addition, the semiconductor substrate provided with at least the growth inhibiting portion or the growth promoting portion on the prescribed region of the principal surface is so employed that the growth inhibiting portion can be prevented from deposition of film forming species when the semiconductor element layer is grown on the semiconductor substrate provided with the growth inhibiting portion, whereby the concentration of film forming species can be increased in a portion of the semiconductor element layer close to the growth inhibiting portion. Thus, the film forming species can so easily deposit on the portion of the semiconductor element layer close to the growth inhibiting portion that this portion can be rendered easier to grow as compared with the remaining portion of the semiconductor element layer. Consequently, the portion of the semiconductor element layer close to the growth inhibiting portion and the remaining portion thereof can be formed with different thicknesses, whereby the semiconductor element layer having the principal surface substantially inclined with respect to the principal surface of the semiconductor substrate can be easily formed. When the semiconductor element layer is grown on the semiconductor substrate provided with the growth promoting portion, on the other hand, deposition of film forming species on the growth promoting portion can be so accelerated that the film forming species can easily deposit on the portion of the semiconductor element layer corresponding to the growth promoting portion. Thus, the portion of the semiconductor element layer corresponding to the growth promoting portion can be rendered easier to grow as compared with the remaining portion of the semiconductor element layer. Consequently, the portion of the semiconductor element layer corresponding to the growth promoting portion and the remaining portion thereof can be formed with different thicknesses, whereby the semiconductor element layer having the principal surface substantially inclined with respect to the principal surface of the semiconductor substrate can be easily formed. Further, the semiconductor substrate provided with at least either the growth inhibiting portion including the defect concentration region or the growth promoting portion is so employed that no growth inhibiting portion or growth promoting portion may be separately formed on the principal surface of the semiconductor substrate, whereby the fabrication process can be simplified.

In the aforementioned method of fabricating a semiconductor laser device according to the third aspect, the step of preparing the semiconductor substrate preferably includes a step of preparing the semiconductor substrate in which the surface of the defect concentration region is terminated with nitrogen. According to this structure, the surface of the growth inhibiting portion including the defect concentration region can be easily prevented from deposition of film forming species.

In the aforementioned method of fabricating a semiconductor laser device according to the third aspect, the step of preparing the semiconductor substrate preferably includes a step of preparing the semiconductor substrate including the growth inhibiting portion so provided as to extend along the <1-100> direction of the semiconductor substrate. According to this structure, a growth component of the semiconductor element layer in the direction (horizontal direction) parallel to the principal surface of the semiconductor substrate can be increased as compared with a case of providing the growth inhibiting portion to extend in a direction along the <11-20> direction of the semiconductor substrate, for example, whereby a defect propagation component in the direction (horizontal direction) parallel to the principal surface of the semiconductor substrate can be increased. Thus, the defects can be further effectively inhibited from propagation to the principal surface of the semiconductor element layer, whereby formation of defects on the principal surface of the semiconductor element layer can be further effectively suppressed.

In the aforementioned method of fabricating a semiconductor laser device according to the third aspect, the step of preparing the semiconductor substrate preferably includes a step of preparing the semiconductor substrate on which a first growth inhibiting portion and a second growth inhibiting portion of the growth inhibiting portion are arranged at a prescribed interval, and the step of growing the semiconductor element layer preferably includes a step of growing the semiconductor element layer having a concave principal surface between the first growth inhibiting portion and the second growth inhibiting portion. According to this structure, defects of the semiconductor element layer can be easily propagated not only in the direction perpendicular to the principal surface of the semiconductor substrate but also in the direction (horizontal direction) parallel thereto in growth of the semiconductor element layer having the concave principal surface, whereby propagation of defects to the principal surface of the semiconductor element layer can be further suppressed as compared with a case where the defects of the semiconductor element layer are propagated only in the direction perpendicular to the principal surface of the semiconductor substrate.

The aforementioned method of fabricating a semiconductor laser device according to the third aspect preferably further comprises a step of forming a projection portion functioning as a current path toward the emission layer on an inclined region of the principal surface of the semiconductor element layer. According to this structure, the projection portion can be easily formed on an inclined plane of the concave principal surface of the semiconductor element layer.

The aforementioned method of fabricating a semiconductor laser device according to the third aspect preferably further comprises a step of forming the top of a projection portion functioning as a current path toward the emission layer on a position lower than the top of the semiconductor element layer. According to this structure, the projection portion can be so arranged inside the concave principal surface of the semiconductor element layer that the same can be further prevented from application of an impact when the semiconductor laser device is mounted on the base or the like.

In the aforementioned method of fabricating a semiconductor laser device according to the third aspect, the misoriented angle of the semiconductor substrate toward the <1-100> direction is preferably at least −0.25° and not more than 0.25°. According to this structure, the inclination of the principal surface of the semiconductor element layer can be increased with respect to the principal surface of the semiconductor substrate, whereby the defect propagation component in the direction (horizontal direction) parallel to the principal surface of the semiconductor substrate can be increased in growth of the semiconductor element layer. Thus, the defects can be further effectively inhibited from propagation to the principal surface of the semiconductor element layer, whereby formation of defects on the principal surface of the semiconductor element layer can be further suppressed.

In the aforementioned method of fabricating a semiconductor laser device according to the third aspect, the misoriented angle of the semiconductor substrate toward the <11-20> direction is preferably not more than −0.05° or at least 0.05°. According to this structure, the inclination of the principal surface of the semiconductor layer can be increased with respect to the principal surface of the semiconductor layer, whereby the principal surface of the semiconductor element layer can be inhibited from nonuniform formation of protuberances in growth of the semiconductor element layer. Thus, the emission layer can be inhibited from uneven formation along protuberances of the semiconductor element layer, whereby light in the emission layer can be inhibited from outgoing from the upper and lower surfaces of the emission layer. Consequently, a light confinement effect can be so improved as to improve luminous efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
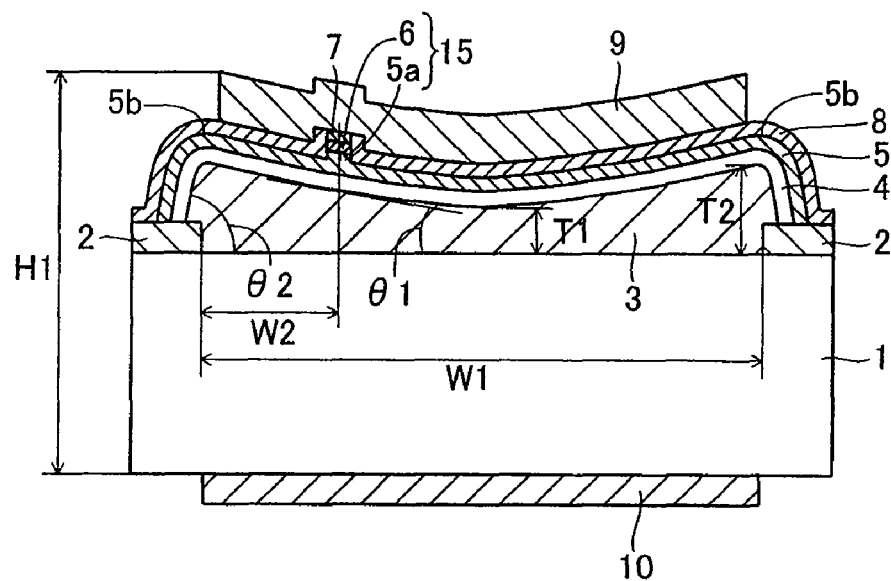
FIG. 1 is a sectional view showing the structure of a nitride-based semiconductor laser device according to a first embodiment of the present invention.
Figure 2:
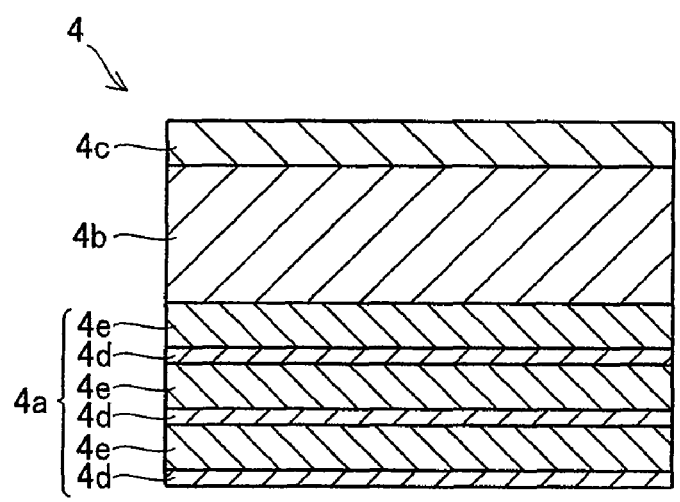
FIG. 2 is an enlarged sectional view showing the detailed structure of an emission layer of the nitride-based semiconductor laser device according to the first embodiment shown in FIG. 1.
Figure 3:
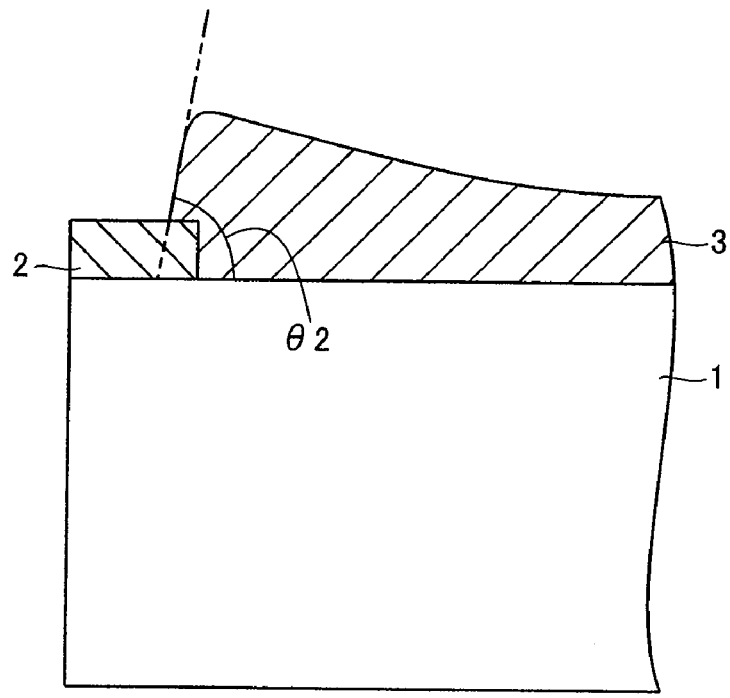
FIGS. 3 and 4 are enlarged sectional views showing the structure of an n-side cladding layer of the nitride-based semiconductor laser device according to the first embodiment shown in FIG. 1.
Figure 4:
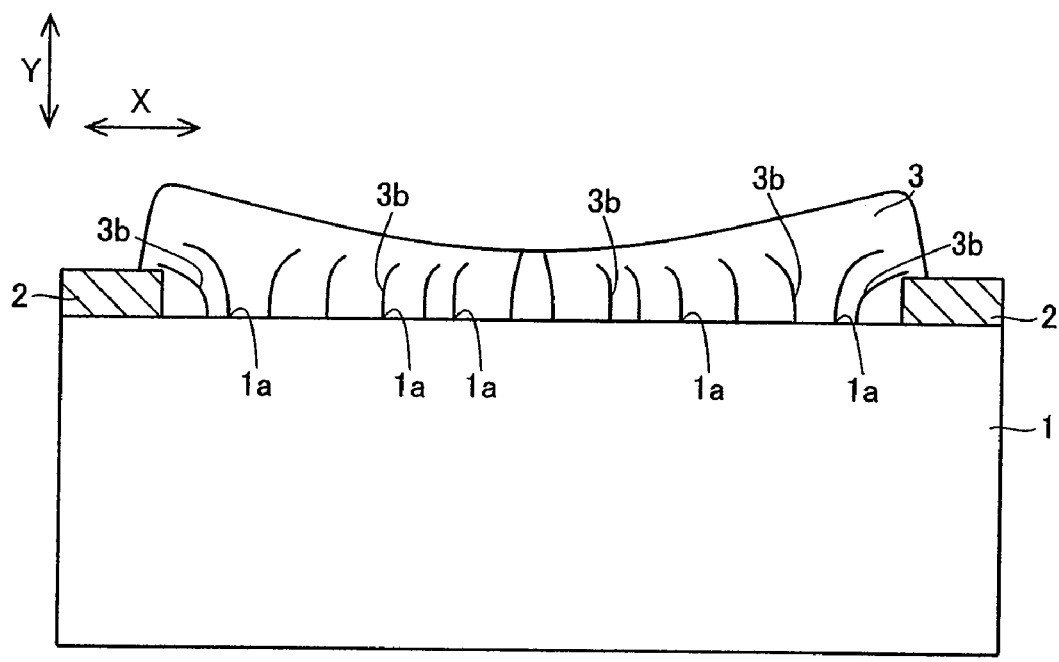
Figure 5:
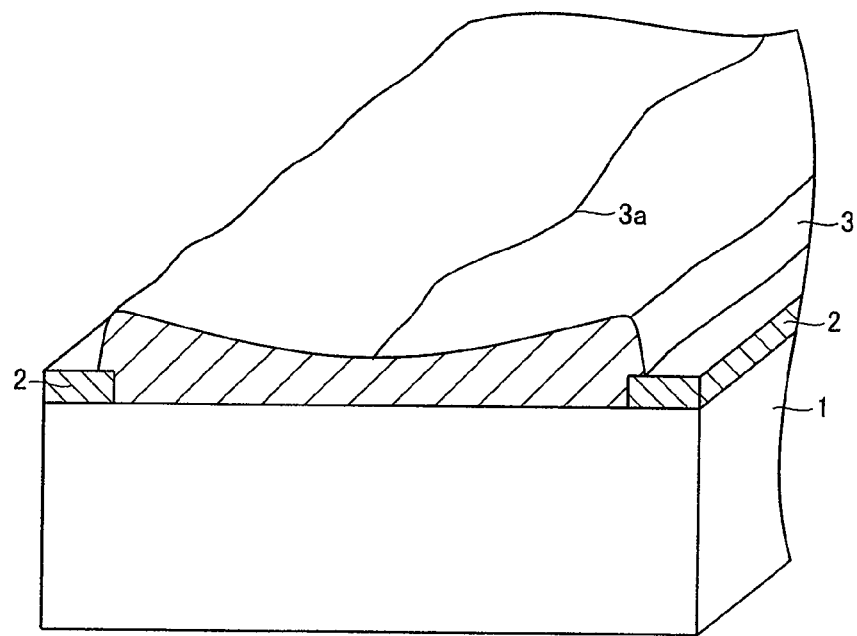
FIG. 5 is a fragmented perspective view showing the structure of the n-side cladding layer of the nitride-based semiconductor laser device according to the first embodiment shown in FIG. 1.
Figure 6:
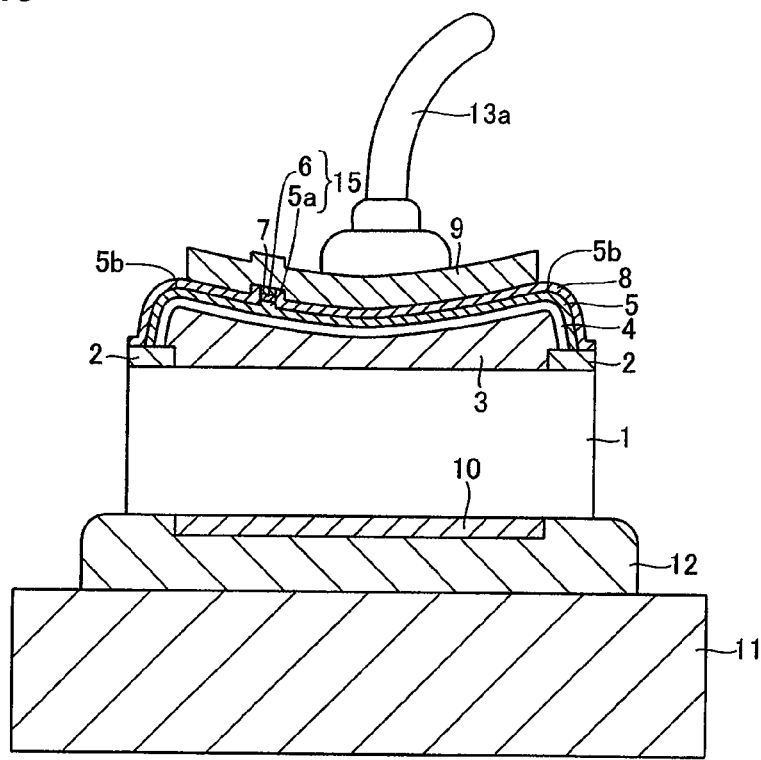
FIGS. 6 and 7 are sectional views of the nitride-based semiconductor laser device according to the first embodiment shown in FIG. 1 mounted on a heat radiator base.
Figure 7:
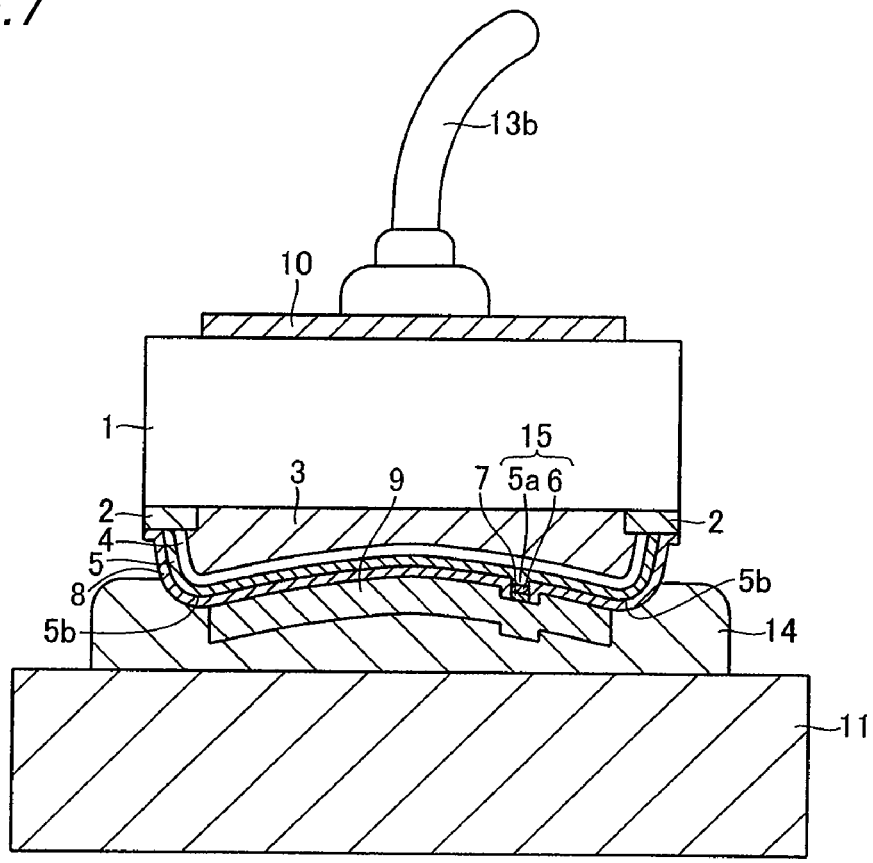

FIG. 1 is a sectional view showing the structure of a nitride-based semiconductor laser device according to a first embodiment of the present invention. FIG. 2 is an enlarged sectional view showing the detailed structure of an emission layer 4 of the nitride-based semiconductor laser device according to the first embodiment shown in FIG. 1. FIGS. 3 to 5 are sectional views for detailedly illustrating the structure of the nitride-based semiconductor laser device according to the first embodiment shown in FIG. 1. FIGS. 6 and 7 are sectional views showing the nitride-based semiconductor laser device according to the first embodiment shown in FIG. 1 mounted on a heat radiator base (submount) 11. The structure of the nitride-based semiconductor laser device according to the first embodiment is now described with reference to FIGS. 1 to 7.

In the nitride-based semiconductor laser device according to the first embodiment, $SiO_2$ films 2 having a thickness of about 0.2 μm and a width of about 25 μm are arranged on of an n-type GaN substrate 1 having defects 1a (see FIG. 4) on the principal surface thereof at a prescribed interval W1 (about 250 μm), as shown in FIG. 1. The n-type GaN substrate 1 is an example of the "semiconductor substrate" in the present invention, and the $SiO_2$ films 2 are examples of the "growth inhibiting portion" in the present invention.

According to the first embodiment, the $SiO_2$ films 2 are formed in a striped manner to extend in the [1-100] direction of the n-type GaN substrate 1 (perpendicular to the plane of FIG. 1). According to the first embodiment, the cavity direction is identical to the [1-100] direction of the semiconductor substrate. An n-side cladding layer 3 of n-type AlGaN is formed on a region of the n-type GaN substrate 1 located between the $SiO_2$ films 2 and partial regions of the $SiO_2$ films 2. The n-side cladding layer 3 is an example of the "semiconductor element layer" in the present invention.

According to the first embodiment, the principal surface (upper surface) of the n-side cladding layer 3 is concaved. The central portion of the n-side cladding layer 3 has a thickness T1 (about 2.3 μm), while side portions thereof have a thickness T2 (about 3.3 μm). The n-side cladding layer 3 is so formed that the principal surface of a portion inward beyond the ends of the $SiO_2$ films 2 by W2 (about 100 μm) is inclined by an angle θ1 (about 0.25°) with respect to the principal surface of the n-type GaN substrate 1. The surface of a peripheral portion of the n-side cladding layer 3 has a prescribed inclination θ2 with respect to the principal surface of the n-type GaN substrate 1. A joint line 3a is formed on the central portion of the upper surface of the n-side cladding layer 3, as shown in FIG. 5. This joint line 3a is formed in growth of the n-side cladding layer 3 due to slight deviation between the heights of surface portions located on the both sides of the joint line 3a. The joint line 3a is waved as viewed from above, and extends along the extensional direction of the $SiO_2$ films 2 (cavity direction). Therefore, the central portion of the upper surface of the n-side cladding layer 3 has unevenness along the cavity direction.

According to the first embodiment, defects (dislocations) 3b are formed in the n-side cladding layer 3, as shown in FIG. 4. These defects 3b are continuous with the defects 1a of the n-type GaN substrate 1. The defects 3b formed in the side portions of the n-side cladding layer 3 are bent outward, not to reach the upper surface of the n-side cladding layer 3. Further, the defects 3b formed in noncentral portions inward beyond the side portions of the n-side cladding layer 3 are bent inward (toward the central portion), not to reach the surface of the n-side cladding layer 3b. On the other hand, the defects 3b formed in the central portion of the n-side cladding layer 3 reach the surface of the n-side cladding layer 3.

The emission layer 4 is formed on the n-side cladding layer 3 to cover the n-side cladding layer 3, as shown in FIG. 1. This emission layer 4 is an example of the "semiconductor element layer" in the present invention. The emission layer 4 is constituted of an active layer 4a of InGaN having a thickness of about 0.07 μm, a light guide layer 4b of InGaN having a thickness of about 0.1 μm and a cap layer 4c of AlGaN having a thickness of about 0.02 μm, as shown in FIG. 2. The active layer 4a has a multiple quantum well (MQW) structure obtained by alternately stacking three well layers 4d of InGaN each having a thickness of about 0.003 μm and three barrier layers 4e of InGaN each having a thickness of about 0.02 μm, as shown in FIG. 2. A p-side cladding layer 5 of AlGaN having a thickness of about 0.25 μm is formed on the emission layer 4 to cover the emission layer 4, as shown in FIG. 1. This p-side cladding layer 5 is an example of the "semiconductor element layer" in the present invention. The p-side cladding layer 5 includes a striped (slender) jut portion 5a having a width of about 1.5 μm and extending in the cavity direction (perpendicular to the plane of FIG. 1) and remaining planar portions. A contact layer 6 of InGaN having a thickness of about 0.003 μm is formed on the jut portion 5a of the p-side cladding layer 5. The contact layer 6 is an example of the "semiconductor element layer" in the present invention. The jut portion 5a of the p-side cladding layer 5 and the contact layer 6 constitute a ridge portion 15 functioning as a current path toward the emission layer 4. The ridge portion 15 is an example of the "projection portion" in the present invention. According to the first embodiment, the thicknesses of the semiconductor element layers are represented by those corresponding to the position formed with the ridge portion 15.

According to the first embodiment, the top of the ridge portion 15 is arranged on a position lower than the tops 5b of the side surfaces of the p-side cladding layer 5. Further, the ridge portion 15 is formed on a portion inward beyond the end of one of the SiO₂ films 2 by W2 (about 100 μm). In other words, the ridge portion 15 is formed on a noncentral inclined plane of the concave principal surface of the p-side cladding layer 5 having an angle θ1 (about 0.25°). Thus, the ridge portion 15 can be formed on a portion of the n-side cladding layer 3 out of the uneven portion along the joint line 3a, thereby preventing a portion of the emission layer 4 close to the ridge portion 15 from unevenness. Therefore, light in the emission layer 4 can be inhibited from outgoing from the upper and lower surfaces of the emission layer 4 without rectilinear propagation, whereby a light confinement effect can be improved. Consequently, luminous efficiency can be improved.

A p-side ohmic electrode 7 is formed on the contact layer 6. This p-side ohmic electrode 7 is constituted of a Pt layer (not shown) having a thickness of about 0.001 μm and a Pd layer (not shown) having a thickness of about 0.01 μm, in ascending order from the side closer to the contact layer 6. An SiO₂ film (current blocking layer) 8 having a thickness of about 0.2 μm is formed to cover the planar portions of the p-side cladding layer 5 and the side surfaces of the contact layer 6 and the p-side ohmic electrode 7. A pad electrode 9 is formed on a partial region of the SiO₂ film 8 and the p-side ohmic electrode 7, to be in contact with the p-side ohmic electrode 7. This pad electrode 9 is an example of the "first electrode" in the present invention. The pad electrode 9 is constituted of a Ti layer (not shown) having a thickness of about 0.1 μm, a Pd layer (not shown) having a thickness of about 0.2 μm and an Au layer (not shown) having a thickness of about 3 μm in ascending order from the side closer to the p-side ohmic electrode 7. The height H1 (see FIG. 1) of the portion located between the upper surface of the pad electrode 9 and the lower surface of the n-type GaN substrate 1 is set to about 100 μm.

An n-side ohmic electrode 10 is formed on a prescribed region of the back surface of the n-type GaN substrate 1. This n-side ohmic electrode 10 is an example of the "second electrode" in the present invention. The n-side ohmic electrode 10 is constituted of an Al layer (not shown) having a thickness of about 0.006 μm, a Pd layer (not shown) having a thickness of about 0.01 μm and an Au layer (not shown) having a thickness of about 0.3 μm in descending order from the side closer to the n-side GaN substrate 1.

The nitride-based semiconductor laser device is mounted on the heat radiator base (submount) 11 in a junction-up state shown in FIG. 6 or a junction-down state shown in FIG. 7. The heat radiator base 11 is an example of the "base" in the present invention. More specifically, the n-side ohmic electrode 10 is mounted on the heat radiator base 11 through a junction layer 12 of solder or the like while a wire 13a is bonded to the upper surface of the pad electrode 9 in the junction-up state, as shown in FIG. 6. In this case, the wire 13a can be bonded to the central portion of the upper surface of the pad electrode 9 formed on the principal surface of the n-side cladding layer 3 while suppressing wire bonding on a portion of the pad electrode 9 located above the ridge portion 15 formed on the noncentral portion of the principal surface of the n-side cladding layer 3 in the state where the n-side ohmic electrode 10 is mounted on the heat radiator base 11. Therefore, no wire bonding may be performed on the ends of the surface of the pad electrode 9, in order to prevent the portion of the pad electrode 9 located above the ridge portion 15 from wire bonding. Thus, the ends of the surface of the pad electrode 9 can be inhibited from chipping in bonding of the wire 13a. In the junction-down state, on the other hand, the pad electrode 9 is mounted on the heat radiator base 11 through a junction layer 14 of solder or the like while a wire 13b is bonded to the n-side ohmic electrode 10, as shown in FIG. 7. In this case, the device including the n-side cladding layer 3 having the ridge portion 15 arranged inside the concave principal surface is mounted on the heat radiator base 11 from the side of the pad electrode 9 formed on the n-side cladding layer 3, whereby the ridge portion 15 located inside the concave principal surface can be prevented from application of an impact when the device is mounted on the heat radiator base 11.

According to the first embodiment, as hereinabove described, the n-side cladding layer 3 having the principal surface substantially inclined with respect to the principal surface of the n-type GaN substrate 1 with the emission layer 4 formed on the principal surface is so provided that the same can be grown with the principal surface inclined with respect to the principal surface of the n-type GaN substrate 1, whereby the n-side cladding layer 3 can be grown not only in a direction Y perpendicular to the principal surface of the n-type GaN substrate 1 but also in a direction X (horizontal direction) parallel thereto. When the defects (dislocations) 3b propagated from the principal surface of the n-type GaN substrate 1 following growth of the n-side cladding layer 3 grow on the n-side cladding layer 3, therefore, the defects 3b of the n-side cladding layer 3 can be propagated not only in the direction Y perpendicular to the principal surface of the n-type GaN substrate 1 but also in the direction X (horizontal direction) parallel thereto, whereby the defects 3b can be further inhibited from propagation to the principal surface of the n-side cladding layer 3 as compared with a case where the defects 3b of the n-side cladding layer 3 are propagated only in the direction Y perpendicular to the principal surface of the n-type GaN substrate 1. Thus, formation of the defects 3b on the principal surface of the n-side cladding layer 3 can be further suppressed, whereby light absorption by the defects 3b can be further suppressed. Further, propagation of the defects 3b to the emission layer 4 and the p-side cladding layer 5 can be so suppressed that light absorption by the defects 3b can be suppressed. Consequently, luminous efficiency can be further improved. In addition, formation of the defects $3b$ on the principal surface of the n-side cladding layer 3 can be further suppressed as described above, whereby the number of nonradiative centers formed in the emission layer 4 can be further reduced. Consequently, the threshold current can be further reduced.

According to the first embodiment, the principal surface of the n-side cladding layer 3 is concaved and the ridge portion 15 is formed on the inclined plane of the concave principal surface of the n-side cladding layer 3 so that the ridge portion 15 can be provided on the inclined plane of the concave principal surface of the n-side cladding layer 3 having a small number of defects $3b$ due to a large horizontal growth component, whereby the number of defects $3b$ can be reduced on a portion of the emission layer 4 around the ridge portion 15. Thus, the luminous efficiency of the emission layer 4 can be further improved.

FIGS. 8 to 20 are sectional views for illustrating a process of fabricating the nitride-based semiconductor laser device according to the first embodiment shown in FIG. 1. The process of fabricating the nitride-based semiconductor laser device according to the first embodiment is now described with reference to FIGS. 1, 2, 4, 5 and 8 to 20.

Figure 8:
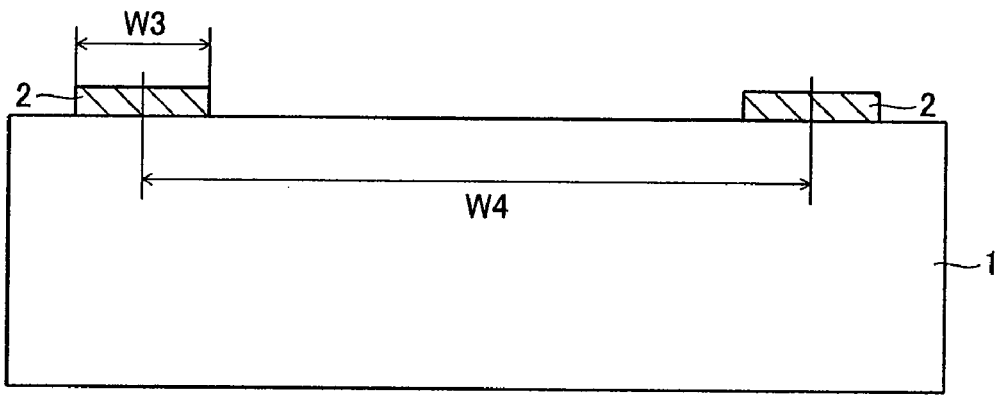
FIGS. 8 to 20 are sectional views for illustrating a process of fabricating the nitride-based semiconductor laser device according to the first embodiment shown in FIG. 1.
Figure 9:
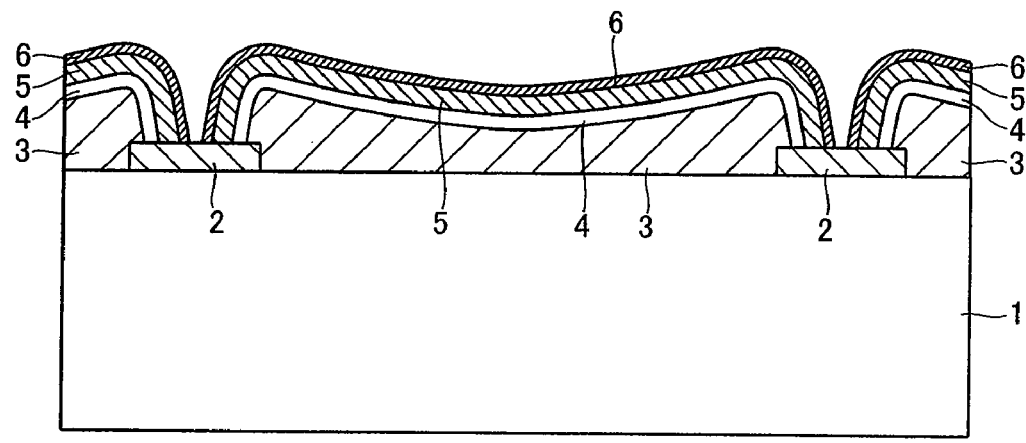

As shown in FIG. 8, the $SiO_2$ films 2 having the thickness of about 0.2 μm and a width W3 (about 50 μm) are formed on the n-type GaN substrate 1 in a cycle W4 (about 300 μm) are prepared. At this time, the $SiO_2$ films 2 are formed in the striped manner to extend in a direction along the [1-100] direction of the n-type GaN substrate 1. As shown in FIG. 9, the n-side cladding layer 3 of n-type AlGaN is grown on the n-type GaN substrate 1 by metal organic chemical vapor deposition (MOCVD), so that the central portion thereof has the thickness T1 (about 2.3 μm) (see FIG. 1). In order to grow the n-side cladding layer 3, the temperature, the gas pressure and the growth rate are set to about 1100° C., about 5.74 Pa and about 0.32 nm/s respectively, while the gas flow rates are set to about 11 sccm for trimethylgallium (TMG), about 5 sccm for trimethylaluminum (TMA), about 6 slm for $NH_3$ and about 20 sccm for $GeH_4$ respectively.

Figure 18:
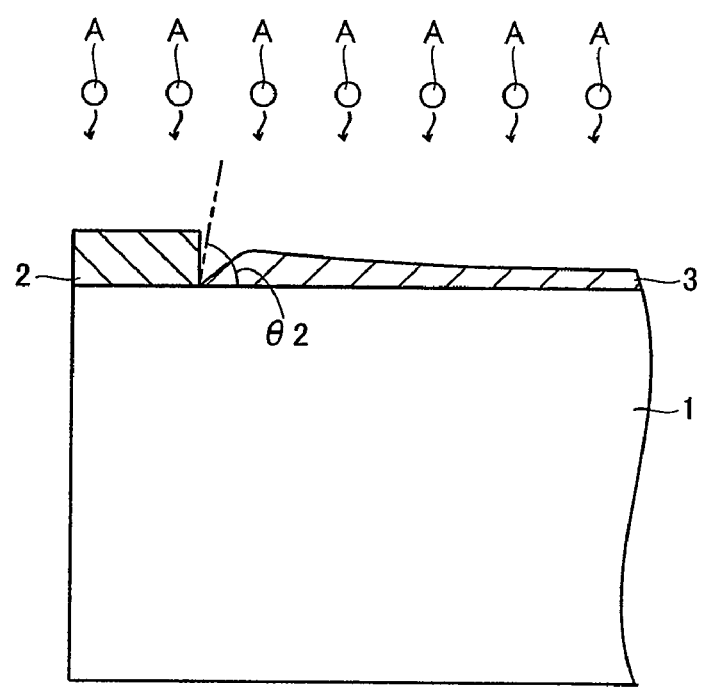
Figure 19:
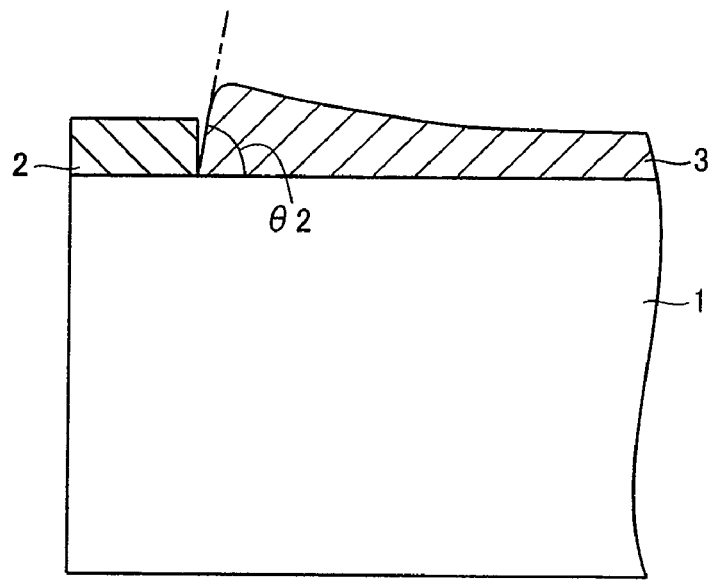

In this case, growth species A are inhibited from depositing on the surfaces of the $SiO_2$ films 2 serving as growth inhibiting portions according to the first embodiment as shown in FIG. 18, whereby the concentration of the growth species A is increased in portions of the n-side cladding layer 3 close to the $SiO_2$ films 2. Thus, the growth species A so easily deposit on the portions of the n-side cladding layer 3 close to the $SiO_2$ films 2 that these portions are easier to grow as compared with the central portion of the n-side cladding layer 3. Consequently, the central portion of the n-side cladding layer 3 and the portions thereof close to the $SiO_2$ films 2 are formed with different thicknesses, whereby the principal surface of the n-side cladding layer 3 is substantially inclined with respect to the principal surface of the n-type GaN substrate 1. In this case, the n-side cladding layer 3 is formed only on the principal surface of the n-type GaN substrate 1 in an initial growth stage, as shown in FIG. 18. Growth of the n-side cladding layer 3 so progresses that the side portions of the n-side cladding layer 3 have the prescribed inclination θ2, as shown in FIG. 19. Thereafter growth of the n-side cladding layer 3 further progresses so that the n-side cladding layer 3 is formed up to the upper surfaces of the $SiO_2$ films 2 while holding the prescribed inclination θ2 on the side portions thereof.

Figure 20:
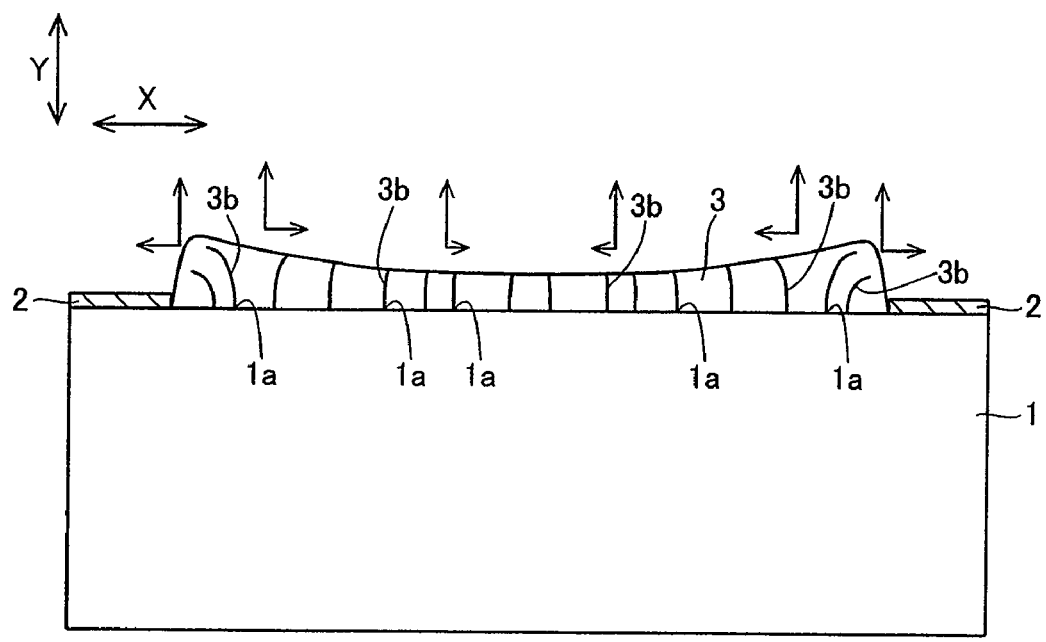

According to the first embodiment, the defects $3b$ are formed in the n-side cladding layer 3 in the growth process thereof continuously with the defects $1a$ of the n-type GaN substrate 1, as shown in FIG. 20. In this case, the n-side cladding layer 3 grows not only in the direction Y perpendicular to the principal surface of the n-type GaN substrate 1 but also in the direction X parallel thereto, as disclosed in literature ("Defect Structure in Selectively Grown GaN Films with Low Threading Dislocation Density", Sakai et al., Appl. Phys. Lett. 71, pp. 2259-2261, 20 Oct. 1997), for example. More specifically, the side portions of the n-side cladding layer 3 outwardly grow from the state shown in FIG. 20, as shown in FIG. 4. Further, the noncentral portions of the n-side cladding layer 3 inward beyond the side portions inwardly grow (toward the central portion). The joint line $3a$ (see FIG. 5) is formed on the central portion of the n-side cladding layer 3. The defects $3b$ formed in the noncentral portions of the n-side cladding layer 3 are bent in the horizontal direction X to disappear, as shown in FIG. 4. At the central portion of the n-side cladding layer 3, on the other hand, the defects $3b$ propagate to the surface of the n-side cladding layer 3 without disappearing, due to a small growth component in the direction X parallel to the surface of the n-type GaN substrate 1.

As shown in FIG. 9, the emission layer 4 is grown to cover the n-side cladding layer 3. In order to grow this emission layer 4, the three well layers $4d$ of InGaN each having the thickness of about 0.003 μm and the three barrier layers $4e$ of InGaN each having the thickness of about 0.02 μm are alternately grown as shown in FIG. 2 for forming a multilayer film of the MQW structure, thereby forming the active layer $4a$ constituted of the MQW structure multilayer film formed by the three well layers $4d$ and the three barrier layers $4e$. In order to grow this active layer $4a$, the temperature, the gas pressure and the growth rate are set to about 850° C., about 5.74 Pa and about 0.11 nm/s respectively, while the gas flow rates are set to about 75 sccm for triethylgallium (TEG), about 230 sccm for trimethylindium (TMI) and about 8 slm for $NH_3$ respectively. Then, the light guide layer $4b$ of InGaN having the thickness of about 0.1 μm and the cap layer $4c$ of AlGaN having the thickness of about 0.02 μm are grown on the active layer $4a$ of InGaN having the thickness of about 0.07 μm. In order to grow the light guide layer $4b$, the temperature, the gas pressure and the growth rate are set to about 860° C., about 5.74 Pa and about 0.11 nm/s respectively, while the gas flow rates are set to about 75 sccm for TEG, about 30 sccm for TMI and about 8 slm for $NH_3$ respectively. In order to grow the cap layer $4c$, further, the temperature, the gas pressure and the growth rate are set to about 1100° C., about 5.74 Pa and about 0.32 nm/s respectively, while the gas flow rates are set to about 20 sccm for TMG, about 250 sccm for TMA and about 8 slm for $NH_3$ respectively. Thereafter the p-side cladding layer 5 of AlGaN having a thickness of about 0.4 μm is grown on the surface of the emission layer 4. In order to grow the p-side cladding layer 5, the temperature, the gas pressure and the growth rate are set to about 1100° C., about 5.74 Pa and about 0.35 nm/s respectively, while the gas flow rates are set to about 11 sccm for TMG, about 5 sccm for TMA, about 6 slm for $NH_3$ and about 20 sccm for bis(cyclopentadienyl) magnesium ($Cp_2Mg$) respectively. Thereafter the contact layer 6 of InGaN having the thickness of about 0.003 μm is grown on the surface of the p-side cladding layer 5. In order to grow the contact layer 6, the temperature, the gas pressure and the growth rate are set to about 850° C., about 5.74 Pa and about 0.11 nm/s respectively, while the gas flow rates are set to about 75 sccm for TEG, about 100 sccm for TMI and about 8 slm for $NH_3$ respectively.

Figure 10:
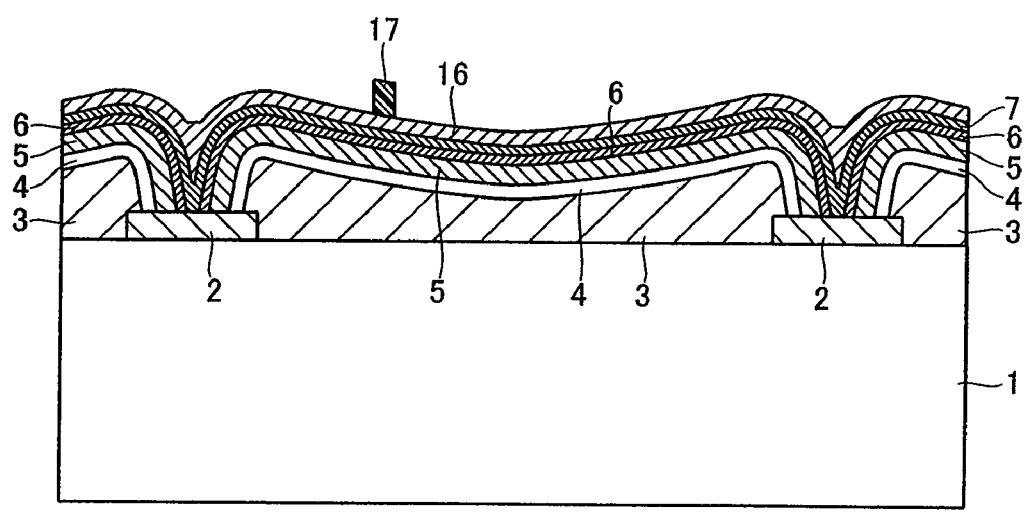

As shown in FIG. 10, the Pt layer (not shown) having the thickness of about 0.001 μm and the Pd layer (not shown) having the thickness of about 0.01 μm are thereafter successively formed on the contact layer 6 by vacuum evaporation or the like, thereby forming the p-side ohmic electrode 7 consisting of the Pt and Pd layers. An $SiO_2$ film 16 having a thickness of about 0.24 µm is formed on the surface of the p-side ohmic electrode 7 by plasma CVD. A striped resist film 17, having a width of about 1.5 µm, extending in the cavity direction is formed on a region (inward beyond the end of one of the SiO₂ films 2 by W2 (about 100 µm)) of the p-side ohmic electrode 7 for forming the ridge portion 15 (see FIG. 1).

Figure 11:
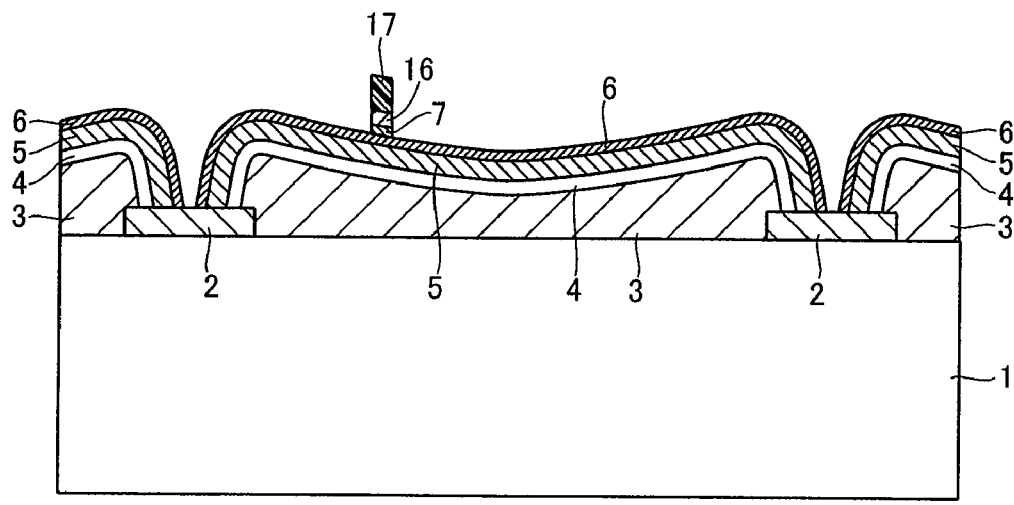

As shown in FIG. 11, prescribed regions of the SiO₂ film 16 and the p-side ohmic electrode 7 are removed by reactive ion etching (RIE) with CF₄ gas through the resist film 17 serving as a mask. Thereafter the resist film 17 is removed.

Figure 12:
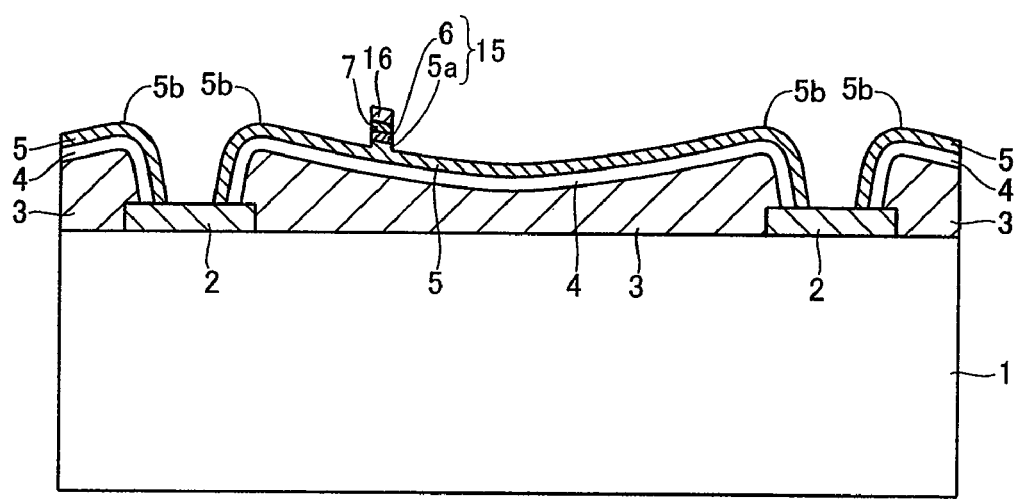

As shown in FIG. 12, prescribed regions between the upper surface of the contact layer 6 and an intermediate portion of the p-side cladding layer 5 (having a depth of about 150 nm from the upper surface of the active layer 4a) are removed by RIE with Cl₂ gas through the SiO₂ film 16 serving as a mask, thereby forming the ridge portion 15 consisting of the jut portion 5a of the p-side cladding layer 5 and the contact layer 6. Thereafter the SiO₂ film 16 is removed.

Figure 13:
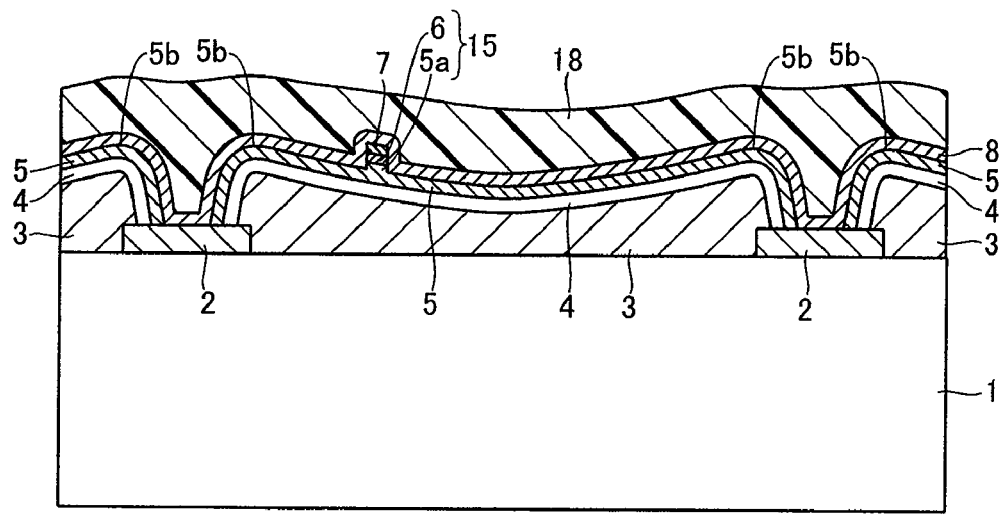
Figure 14:
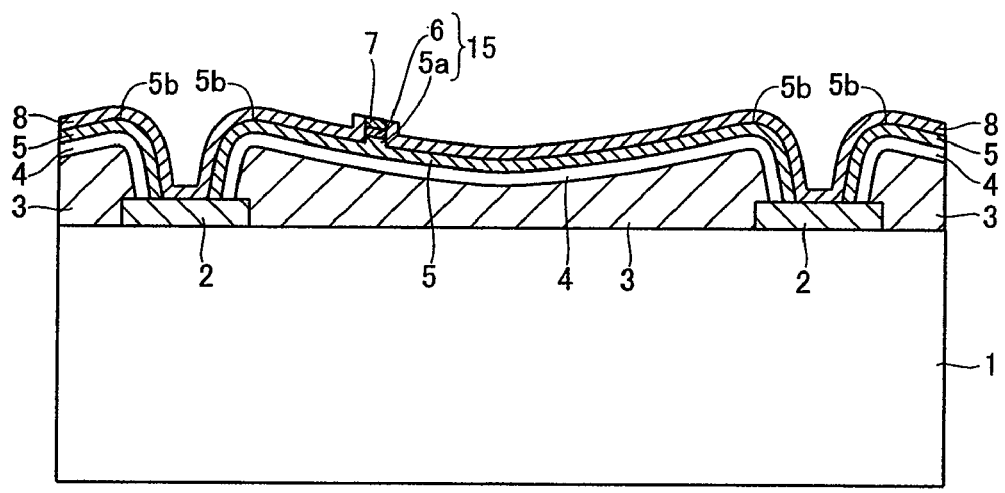

As shown in FIG. 13, the SiO₂ film 8 having the thickness of about 0.2 µm is formed by plasma CVD to cover the overall surface. A resist film 18 is applied to cover the SiO₂ film 8. Then, the resist film 18 is partially removed by oxygen plasma etching, to expose a portion of the SiO₂ film 8 located on the ridge portion 15. Thereafter the portion of the SiO₂ film 8 located on the ridge portion 15 is removed by RIE with CF₄ gas through the resist film 18 serving as a mask, thereby forming the current blocking layer consisting of the SiO₂ film 8 having a shape shown in FIG. 14. Thereafter the resist film 18 is removed.

Figure 15:
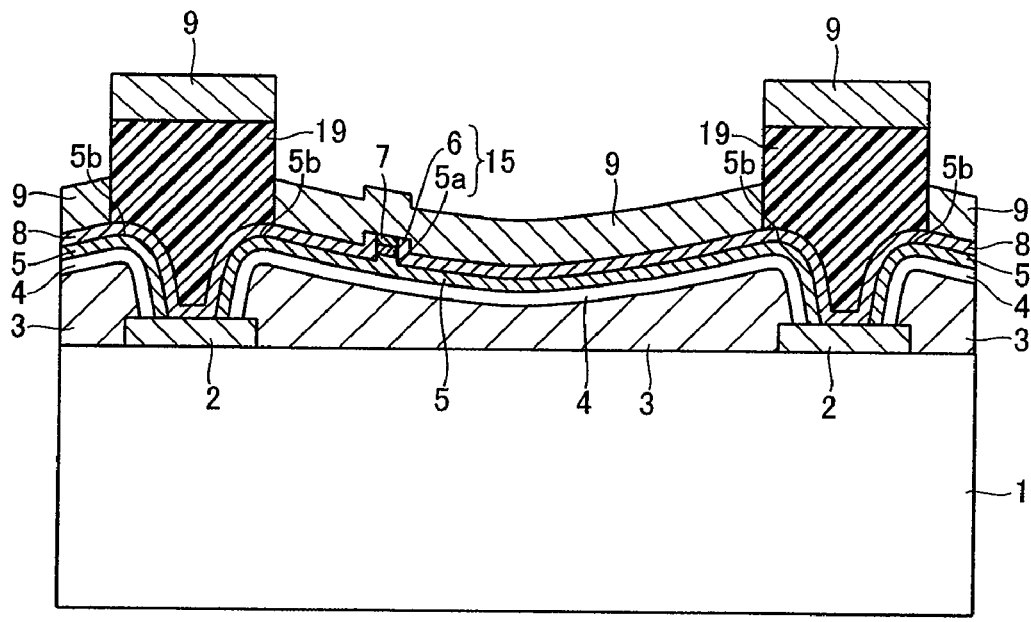
Figure 16:
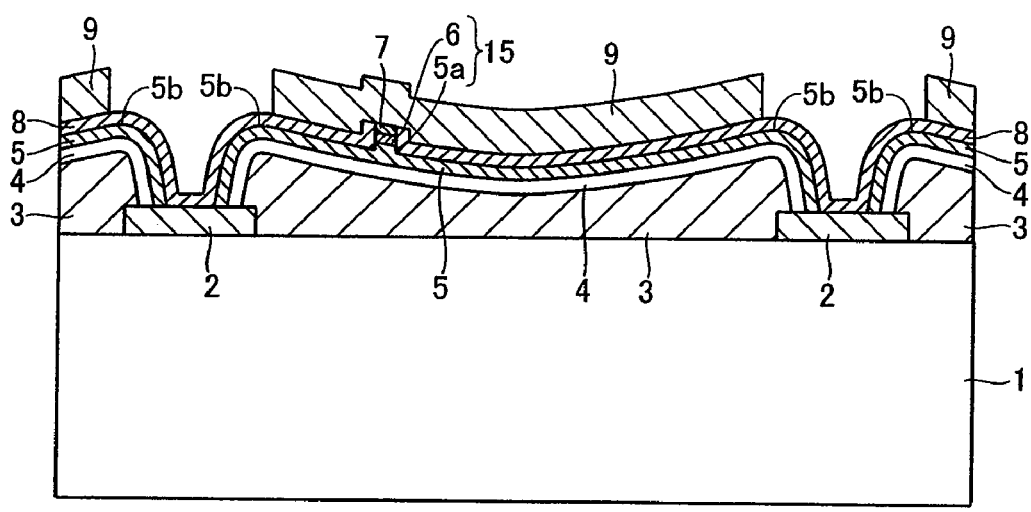

As shown in FIG. 15, resist films 19 are formed on regions other than that for forming the pad electrode 9, and the Ti layer (not shown) having the thickness of about 0.1 µm, the Pd layer (not shown) having the thickness of about 0.2 µm and the Au layer (not shown) having the thickness of about 3 µm are formed in this order by vacuum evaporation or the like, thereby forming the pad electrode 9. Thereafter the resist films 19 are removed, thereby forming the pad electrode 9 constituted of the patterned Ti, Pd and Au layers as shown in FIG. 16. Thereafter the lower surface of the n-type GaN substrate 1 is polished, so that the height H1 (see FIG. 1) of the portion located between the upper surface of the pad electrode 9 and the lower surface of the n-type GaN substrate 1 is about 100 µm.

Figure 17:
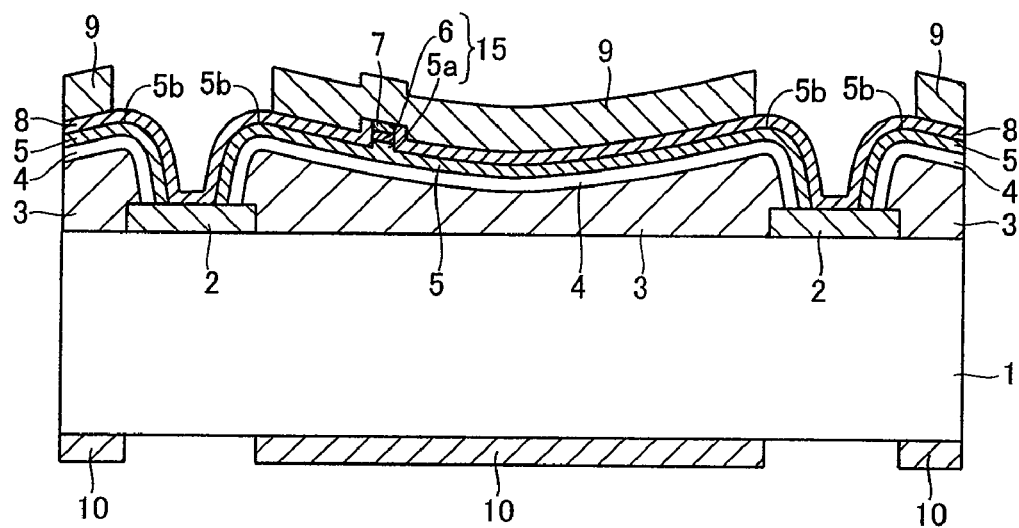

As shown in FIG. 17, the Al layer (not shown) having the thickness of about 0.006 µm, the Pd layer (not shown) having the thickness of about 0.01 µm and the Au layer (not shown) having the thickness of about 0.3 µm are formed in this order on the prescribed region of the back surface of the n-type GaN substrate 1 by vacuum evaporation or the like, thereby forming the n-side ohmic electrode 10 consisting of the Al, Pd and Au layers. The n-type GaN substrate 1 is divided into each device, thereby forming the nitride-based semiconductor laser device according to the first embodiment shown in FIG. 1.

An experiment conducted in relation to propagation of defects 3b in n-type GaN substrates 1 formed with SiO₂ films 2 in different directions with respect to the n-type GaN substrates 1 is now described. In this experiment, the n-type GaN substrates 1 were formed with the SiO₂ films 2 extending in directions along the [1-100] and [11-20] directions respectively, and n-side cladding layers 3 were grown on the surfaces of these n-type GaN substrates 1. Consequently, it has been proved that a propagation component for defects 3b in a direction parallel to the surface of the n-type GaN substrate 1 formed with the SiO₂ films 2 extending in the direction along the [1-100] direction is more increased and the defects 3b on the surface of the n-side cladding layer 3 are more easily disappear as compared with the n-type GaN substrate 1 formed with the SiO₂ films 2 extending in the direction along the [11-20] direction. Thus, it is preferable to employ the n-type GaN substrate 1 formed with the SiO₂ films 2 extending in the direction along the [1-100] direction.

Second Embodiment

Figure 21:
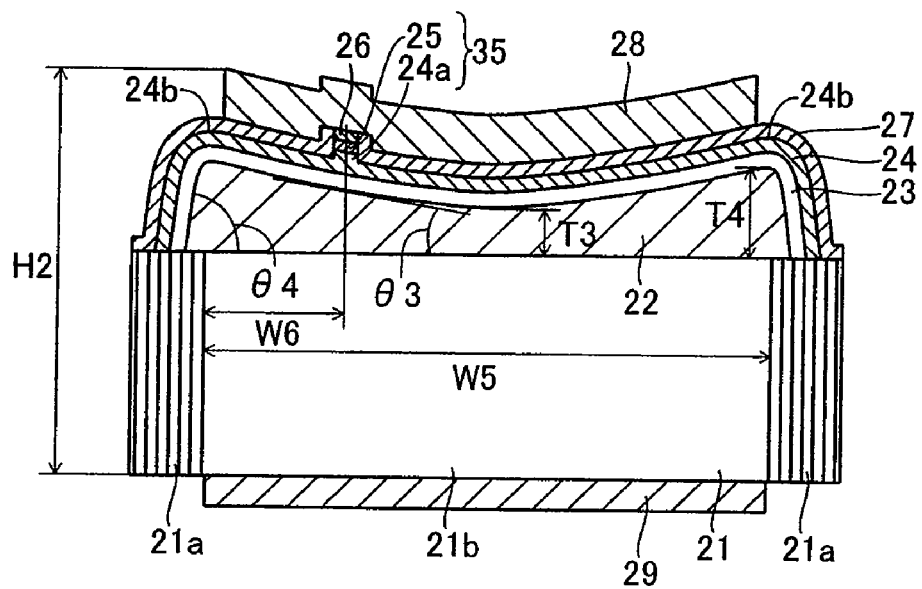
FIG. 21 is a sectional view showing the structure of a nitride-based semiconductor laser device according to a second embodiment of the present invention.
Figure 22:
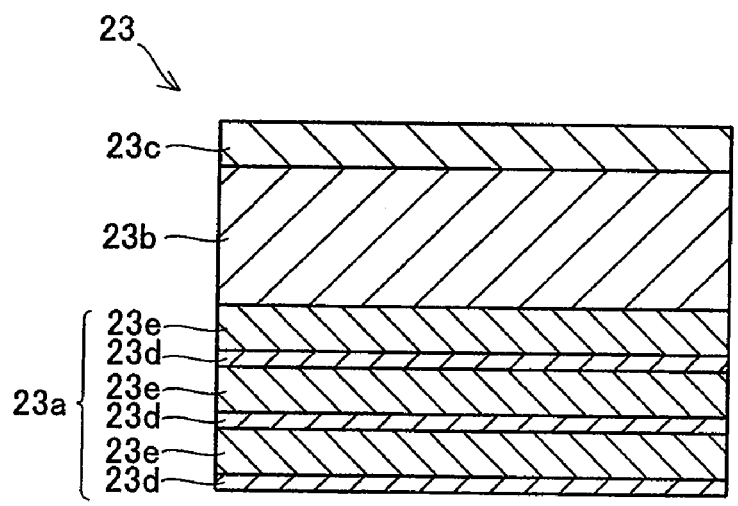
FIG. 22 is an enlarged sectional view showing the detailed structure of an emission layer of the nitride-based semiconductor laser device according to the second embodiment show in FIG. 21.
Figure 23:
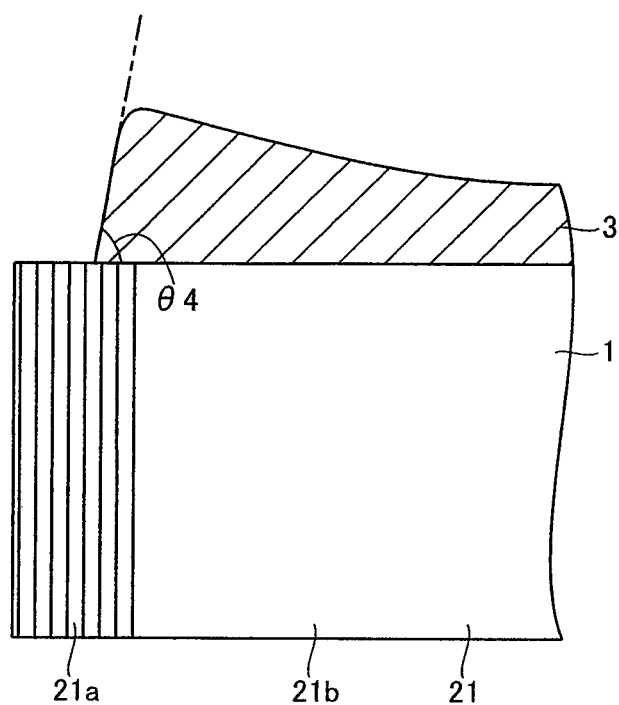
FIGS. 23 and 24 are sectional views showing the structure of an n-side cladding layer of the nitride-based semiconductor laser device according to the second embodiment shown in FIG. 21.
Figure 24:
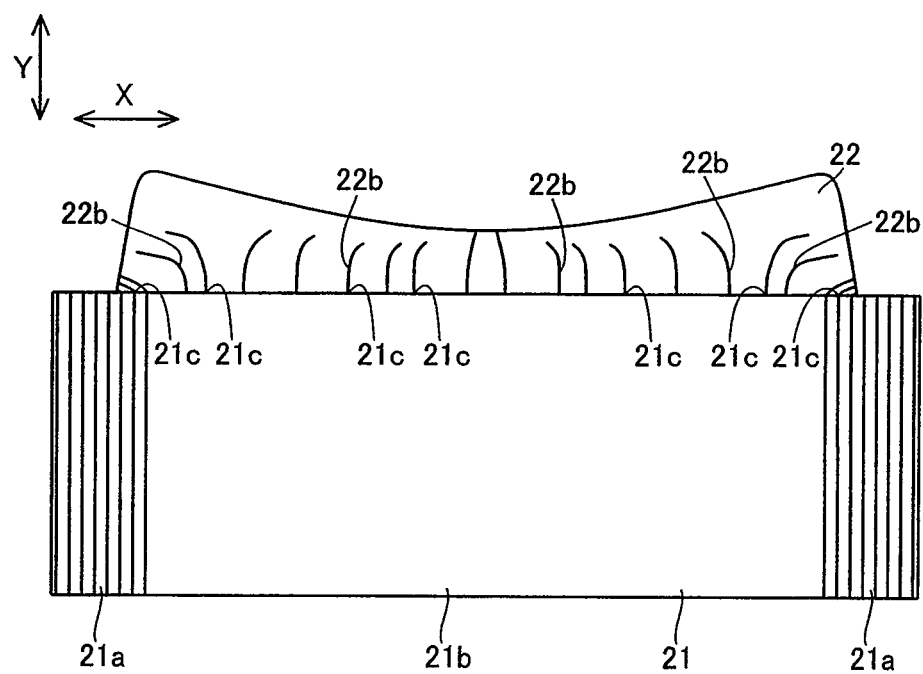
Figure 25:
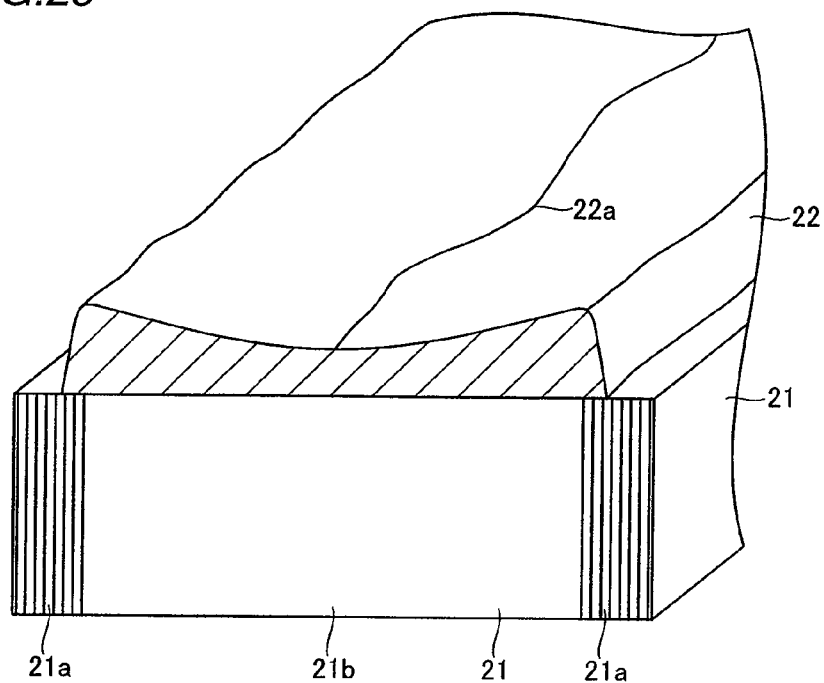
FIG. 25 is a fragmented perspective view showing the structure of the n-side cladding layer of the nitride-based semiconductor laser device according to the second embodiment shown in FIG. 21.
Figure 26:
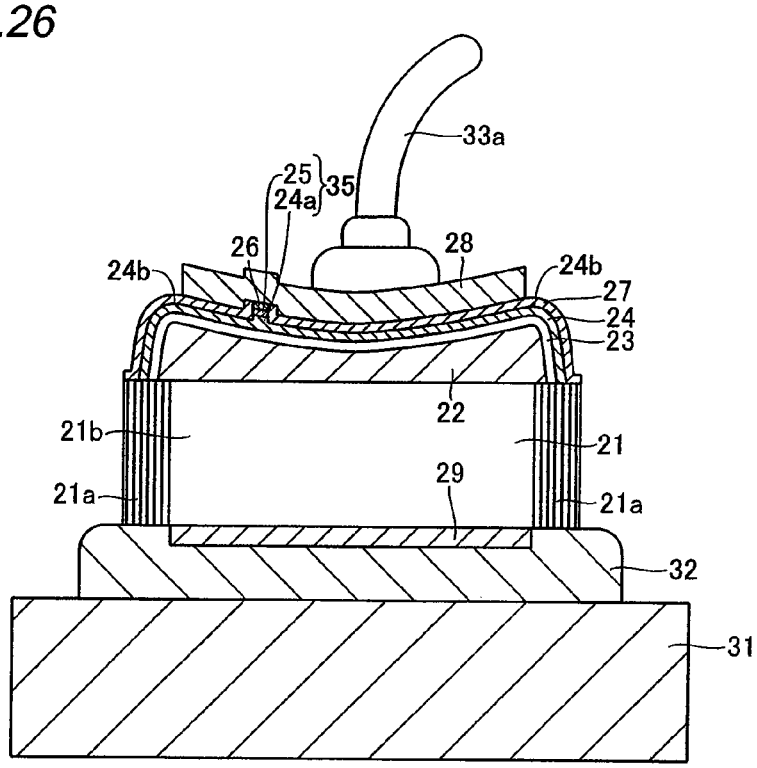
FIGS. 26 and 27 are sectional views of the nitride-based semiconductor laser device according to the second embodiment shown in FIG. 21 mounted on a heat radiator base.
Figure 27:
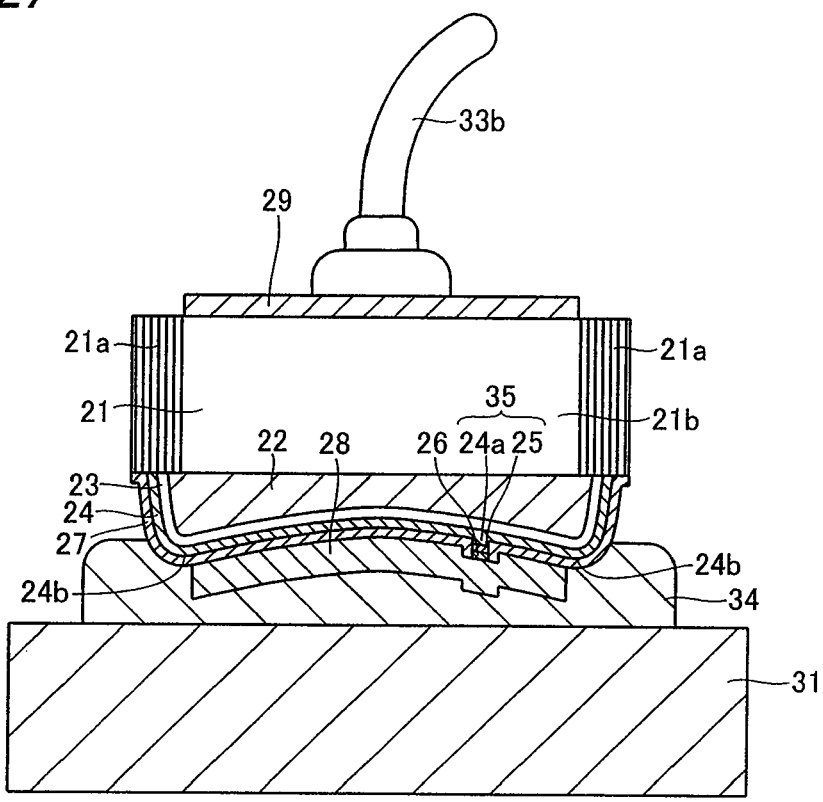

FIG. 21 is a sectional view showing the structure of a nitride-based semiconductor laser device according to a second embodiment of the present invention. FIG. 22 is an enlarged sectional view showing the detailed structure of an emission layer 23 of the nitride-based semiconductor laser device according to the second embodiment shown in FIG. 21. FIGS. 23 to 25 are sectional views for detailedly illustrating the structure of the nitride-based semiconductor laser device according to the second embodiment shown in FIG. 21. FIGS. 26 and 27 are sectional views showing the nitride-based semiconductor laser device according to the second embodiment shown in FIG. 21 mounted on a heat radiator base (submount) 31. The structure of the nitride-based semiconductor laser device according to the second embodiment is now described with reference to FIGS. 21 to 27.

In the nitride-based semiconductor laser device according to the second embodiment, an n-type GaN substrate 21 includes defect concentration regions 21a formed on ends of the n-type GaN substrate 21 with principal surfaces terminated with nitrogen and a low defect density region 21b arranged between the defect concentration regions 21a. The n-type GaN substrate 21 is an example of the "semiconductor substrate" in the present invention, and the defect concentration regions 21a are examples of the "growth inhibiting portion" in the present invention. The defect concentration regions 21a having a width of about 25 µm are arranged at a prescribed interval W5 (about 350 µm).

According to the second embodiment, the defect concentration regions 21a are formed in a striped manner to extend in the [1-100] direction of the n-type GaN substrate 21 (perpendicular to the plane of FIG. 21). According to the second embodiment, the cavity direction is identical to the [1-100] direction of the semiconductor substrate. An n-side cladding layer 22 of n-type AlGaN is formed on the low defect density region 21b and partial regions of the defect concentration regions 21a. The n-side cladding layer 22 is an example of the "semiconductor element layer" in the present invention.

According to the second embodiment, the principal surface (upper surface) of the n-side cladding layer 22 is concaved. The central portion of the n-side cladding layer 22 has a thickness T3 (about 2.3 µm), while side portions thereof have a thickness T4 (about 2.8 µm). The n-side cladding layer 22 is so formed that the principal surface of a portion inward beyond the end of one of the defect concentration regions 21a by W6 (about 130 µm) is inclined by an angle θ3 (about 0.2°) with respect to the principal surface of the n-type GaN substrate 21. The surface of a peripheral portion of the n-side cladding layer 22 has a prescribed inclination θ4 with respect to the principal surface of the n-type GaN substrate 21. A joint line 22a is formed on the central portion of the upper surface of the n-side cladding layer 22, as shown in FIG. 25. This joint line 22a is formed in growth of the n-side cladding layer 22 due to slight deviation between the heights of surface portions located on both sides of the joint line 22a. The joint line 22a is waved as viewed from above, and extends along the extensional direction of the defect concentration regions 21a (cavity direction). Therefore, the central portion of the upper surface of the n-side cladding layer 22 has unevenness along the cavity direction.

According to the second embodiment, defects (dislocations) 22b are formed in the n-side cladding layer 22, as shown in FIG. 24. These defects 22b are continuous with the defects 21c of the surfaces of the defect concentration regions 21a and the low defect density region 21b of the n-type GaN substrate 21. The defects 22b formed in the side portions of the n-side cladding layer 22 are bent outward. Further, the defects 22b formed in noncentral portions inward beyond the side portions of the n-side cladding layer 22 are bent inward (toward the central portion), not to reach the surface of the n-side cladding layer 22. On the other hand, the defects 22b formed in the central portion of the n-side cladding layer 22 reach the surface of the n-side cladding layer 22.

The emission layer 23 is formed on the n-side cladding layer 22 to cover the n-side cladding layer 22, as shown in FIG. 21. This emission layer 23 is an example of the "semiconductor element layer" in the present invention. The emission layer 23 is constituted of an active layer 23a of InGaN having a thickness of about 0.07 μm, a light guide layer 23b of InGaN having a thickness of about 0.1 μm and a cap layer 23c of AlGaN having a thickness of about 0.02 μm, as shown in FIG. 22. The active layer 23a has an MQW structure obtained by alternately stacking three well layers 23d of InGaN each having a thickness of about 0.003 μm and three barrier layers 23e of InGaN each having a thickness of about 0.02 μm. A p-side cladding layer 24 of AlGaN having a thickness of about 0.25 μm is formed on the emission layer 23 to cover the emission layer 23, as shown in FIG. 21. This p-side cladding layer 24 is an example of the "semiconductor element layer" in the present invention. The p-side cladding layer 24 includes a striped (slender) jut portion 24a having a width of about 1.5 μm and extending in the cavity direction (perpendicular to the plane of FIG. 21) and remaining planar portions. A contact layer 25 of InGaN having a thickness of about 0.003 μm is formed on the jut portion 24a of the p-side cladding layer 24. The contact layer 25 is an example of the "semiconductor element layer" in the present invention. The jut portion 24a of the p-side cladding layer 24 and the contact layer 25 constitute a ridge portion 35 functioning as a current path toward the emission layer 23. The ridge portion 35 is an example of the "projection portion" in the present invention. According to the second embodiment, the thicknesses of the semiconductor element layers are represented by those corresponding to the position formed with the ridge portion 35.

According to the second embodiment, the top of the ridge portion 35 is arranged on a position lower than the tops 24b of the side surfaces of the p-side cladding layer 24. Further, the ridge portion 35 is formed on the portion inward beyond the end of one of the defect concentration regions 21a by W6 (about 130 μm). In other words, the ridge portion 35 is formed on a noncentral inclined plane of the concave principal surface of the p-side cladding layer 24 having an angle θ3 (about 0.2°). Thus, the ridge portion 35 can be formed on a portion of the n-side cladding layer 3 out of the uneven portion along the joint line 22a, thereby preventing a portion of the emission layer 23 close to the ridge portion 35 from unevenness. Therefore, light in the emission layer 23 can be inhibited from outgoing from the upper and lower surfaces of the emission layer 23 without rectilinear propagation, whereby a light confinement effect can be improved. Consequently, luminous efficiency can be improved.

A p-side ohmic electrode 26 is formed on the contact layer 25. This p-side ohmic electrode 26 is constituted of a Pt layer (not shown) having a thickness of about 0.001 μm and a Pd layer (not shown) having a thickness of about 0.01 μm, in ascending order from the side closer to the contact layer 25. An SiO$_2$ film (current blocking layer) 27 having a thickness of about 0.2 μm is formed to cover the planar portions of the p-side cladding layer 24 and the side surfaces of the contact layer 25 and the p-side ohmic electrode 26. A pad electrode 28 is formed on a partial region of the SiO$_2$ film 27 and the p-side ohmic electrode 26, to be in contact with the p-side ohmic electrode 26. This pad electrode 28 is an example of the "first electrode" in the present invention. The pad electrode 28 is constituted of a Ti layer (not shown) having a thickness of about 0.1 μm, a Pd layer (not shown) having a thickness of about 0.2 μm and an Au layer (not shown) having a thickness of about 3 μm in ascending order from the side closer to the p-side ohmic electrode 26. The height H2 (see FIG. 21) of the portion located between the upper surface of the pad electrode 28 and the lower surface of the n-type GaN substrate 21 is set to about 100 μm.

An n-side ohmic electrode 29 is formed on a prescribed region of the back surface of the n-type GaN substrate 21. This n-side ohmic electrode 29 is an example of the "second electrode" in the present invention. The n-side ohmic electrode 29 is constituted of an Al layer (not shown) having a thickness of about 0.006 μm, a Pd layer (not shown) having a thickness of about 0.01 μm and an Au layer (not shown) having a thickness of about 0.3 μm in descending order from the side closer to the n-side GaN substrate 21.

The nitride-based semiconductor laser device is mounted on the heat radiator base (submount) 31 in a junction-up state shown in FIG. 26 or a junction-down state shown in FIG. 27. The heat radiator base 31 is an example of the "base" in the present invention. More specifically, the n-side ohmic electrode 29 is mounted on the heat radiator base 31 through a junction layer 32 of solder or the like while a wire 33a is bonded to the upper surface of the pad electrode 28 in the junction-up state, as shown in FIG. 26. In this case, the wire 33a can be bonded to the central portion of the upper surface of the pad electrode 28 formed on the principal surface of the n-side cladding layer 22 while suppressing wire bonding on a portion of the pad electrode 28 located above the ridge portion 35 formed on the noncentral portion of the principal surface of the n-side cladding layer 22 in the state where the n-side ohmic electrode 29 is mounted on the heat radiator base 31. Therefore, no wire bonding may be performed on the ends of the surface of the pad electrode 28, in order to prevent the portion of the pad electrode 28 located above the ridge portion 35 from wire bonding. Thus, the ends of the surface of the pad electrode 28 can be inhibited from chipping in bonding of the wire 33a. In the junction-down state, on the other hand, the pad electrode 28 is mounted on the heat radiator base 31 through a junction layer 34 of solder or the like while a wire 33b is bonded to the n-side ohmic electrode 29, as shown in FIG. 27. In this case, the device including the n-side cladding layer 22 having the ridge portion 35 arranged inside the concave principal surface is mounted on the heat radiator base 31 from the side of the pad electrode 28 formed on the n-side cladding layer 22, whereby the ridge portion 35 located inside the concave principal surface can be prevented from application of an impact when the device is mounted on the heat radiator base 31.

According to the second embodiment, as hereinabove described, the n-side cladding layer 22 having the principal surface substantially inclined with respect to the principal surface of the n-type GaN substrate 21 with the emission layer 23 formed on the principal surface is so provided that the same can be grown with the principal surface inclined with respect to the principal surface of the n-type GaN substrate 21, whereby the n-side cladding layer 22 can be grown not only in a direction Y perpendicular to the principal surface of the n-type GaN substrate 21 but also in a direction X (horizontal direction) parallel thereto. When the defects 22b propagated from the principal surface of the n-type GaN substrate 21 following growth of the n-side cladding layer 22 propagate on the n-side cladding layer 22, therefore, the defects 22b of the n-side cladding layer 22 can be propagated not only in the direction Y perpendicular to the principal surface of the n-type GaN substrate 21 but also in the direction X (horizontal direction) parallel thereto, whereby the defects 22b can be further inhibited from propagation to the principal surface of the n-side cladding layer 22 as compared with a case where the defects 22b of the n-side cladding layer 22 are propagated only in the direction Y perpendicular to the principal surface of the n-type GaN substrate 21. Thus, formation of the defects 22b on the principal surface of the n-side cladding layer 22 can be further suppressed, whereby light absorption by the defects 22b can be further suppressed. Further, propagation of the defects 22b to the emission layer 23 and the p-side cladding layer 24 can be so suppressed that light absorption by the defects 22b can be suppressed. Consequently, luminous efficiency can be further improved. In addition, formation of the defects 22b on the principal surface of the n-side cladding layer 22 can be further suppressed as described above, whereby the number of nonradiative centers formed in the emission layer 23 can be further reduced. Consequently, the threshold current can be further reduced.

The remaining effects of the second embodiment are similar to those of the aforementioned first embodiment.

FIGS. 28 to 40 are sectional views for illustrating a process of fabricating the nitride-based semiconductor laser device according to the second embodiment shown in FIG. 21. The process of fabricating the nitride-based semiconductor laser device according to the second embodiment is now described with reference to FIGS. 21, 22, 24, 25 and 28 to 40.

Figure 28:
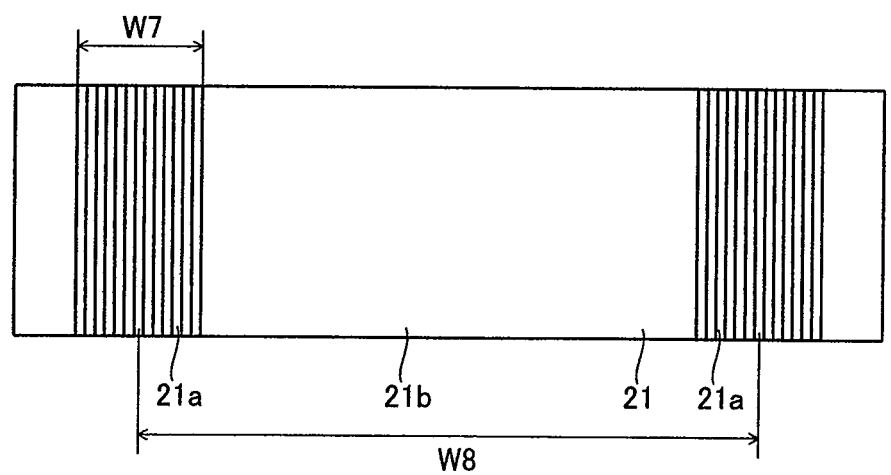
FIGS. 28 to 40 are sectional views for illustrating a process of fabricating the nitride-based semiconductor laser device according to the second embodiment shown in FIG. 21.

As shown in FIG. 28, the n-type GaN substrate 21 including the defect concentration regions 21a, having a width W7 (about 50 μm), arranged in a cycle W8 (about 400 μm) and the low defect density region 21b arranged between the defect concentration regions 21a are prepared. The principal surfaces of the defect concentration regions 21a are terminated with nitrogen, so that growth species A can be inhibited from depositing on the principal surfaces of the defect concentration regions 21a. The misoriented angles of the n-type GaN substrate 21 toward the [1-100] and [11-20] directions are −0.15° and 0.15° respectively, for example. The crystal orientation on the surface of the n-type GaN substrate 21 is the (0001) plane, while the defect concentration regions 21a are formed in the striped manner to extend in a direction along the [1-100] direction of the n-type GaN substrate 21. Then, the n-side cladding layer 22 of n-type AlGaN is grown on the n-type GaN substrate 21 by MOCVD, so that the central portion thereof has the thickness T3 (about 2.3 μm) (see FIG. 21). In order to grow the n-side cladding layer 22, the temperature, the gas pressure and the growth rate are set to about 1100° C., about 5.74 Pa and about 0.32 nm/s respectively, while the gas flow rates are set to about 11 sccm for TMG, about 5 sccm for TMA, about 6 slm for $NH_3$ and about 20 sccm for $GeH_4$ respectively.

Figure 38:
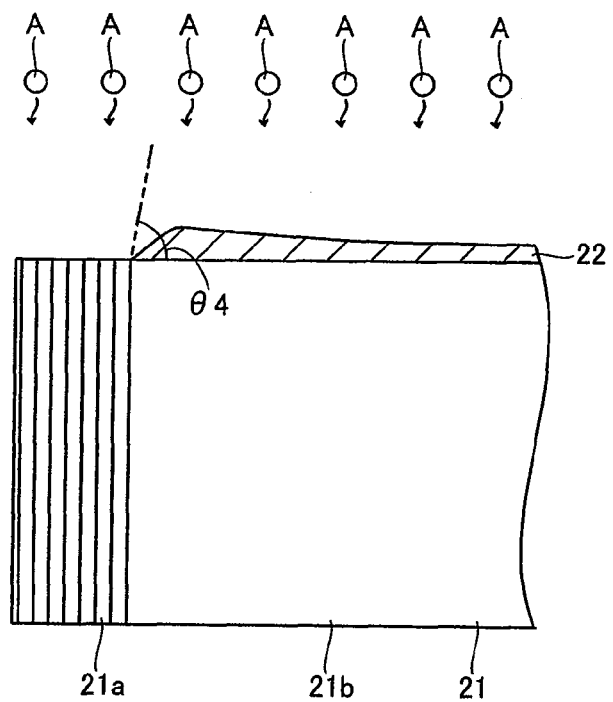
Figure 39:
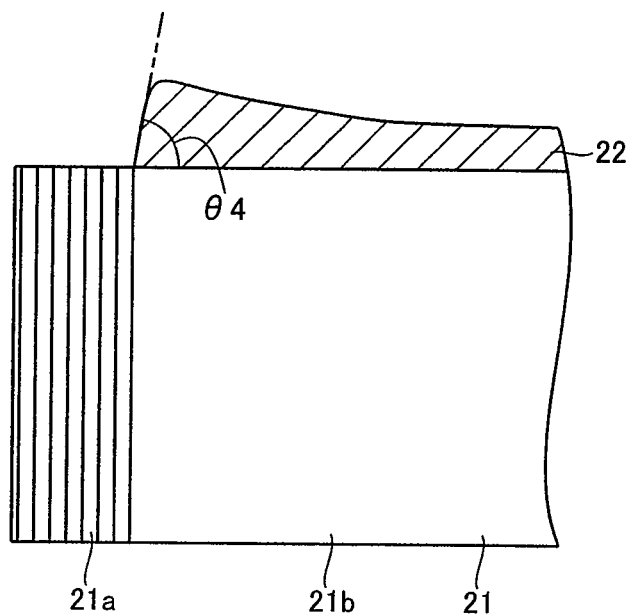

In this case, growth species A are inhibited from depositing on the surfaces of the defect concentration regions 21a serving as growth inhibiting portions according to the second embodiment as shown in FIG. 38, whereby the concentration of the growth species A is increased in portions of the n-side cladding layer 22 close to the defect concentration regions 21a. Thus, the growth species A so easily deposit on the portions of the n-side cladding layer 22 close to the defect concentration regions 21a that these portions are easier to grow as compared with the central portion of the n-side cladding layer 22. Consequently, the central portion of the n-side cladding layer 22 and the portions thereof close to the defect concentration regions 21a are formed with different thicknesses, whereby the principal surface of the n-side cladding layer 22 is substantially inclined with respect to the principal surface of the n-type GaN substrate 21. In this case, the n-side cladding layer 22 is formed only on the low defect density region 21b in an initial growth stage, as shown in FIG. 38. Growth of the n-side cladding layer 22 so progresses that the side portions of the n-side cladding layer 22 have the prescribed inclination θ4, as shown in FIG. 39. Thereafter growth of the n-side cladding layer 22 further progresses so that the n-side cladding layer 22 is formed up to the upper surfaces of the defect concentration regions 21a while holding the prescribed inclination θ4 on the side portions thereof.

Figure 40:
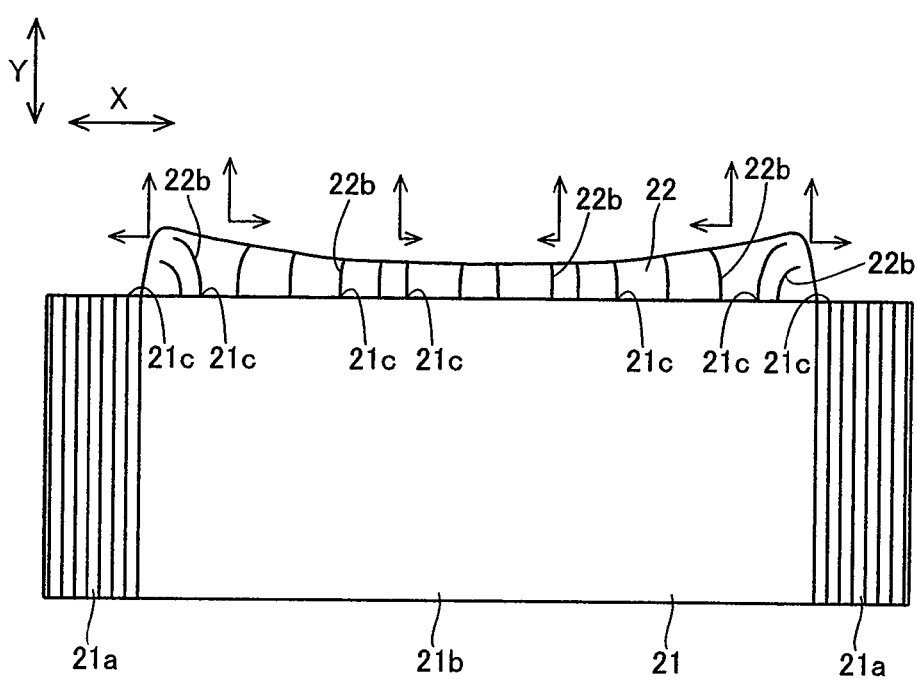

According to the second embodiment, the defects 22b are formed in the n-side cladding layer 22 in the growth process thereof continuously with the defects 21c of the n-type GaN substrate 21, as shown in FIG. 40. In this case, the n-side cladding layer 22 grows not only in the direction Y perpendicular to the principal surface of the n-type GaN substrate 21 but also in the direction X parallel thereto. More specifically, the side portions of the n-side cladding layer 22 outwardly grow from the state shown in FIG. 40, as shown in FIG. 24. Further, the noncentral portions of the n-side cladding layer 32 inward beyond the side portions inwardly grow (toward the central portion). The joint line 22a (see FIG. 25) is formed on the central portion of the n-side cladding layer 22. The defects 22b formed in the noncentral portions of the n-side cladding layer 22 are bent in the horizontal direction X to disappear, as shown in FIG. 24. At the central portion of the n-side cladding layer 22, on the other hand, the defects 22b propagate to the surface of the n-side cladding layer 22 without disappearing, due to a small growth component in the direction X parallel to the surface of the n-type GaN substrate 21.

Figure 29:
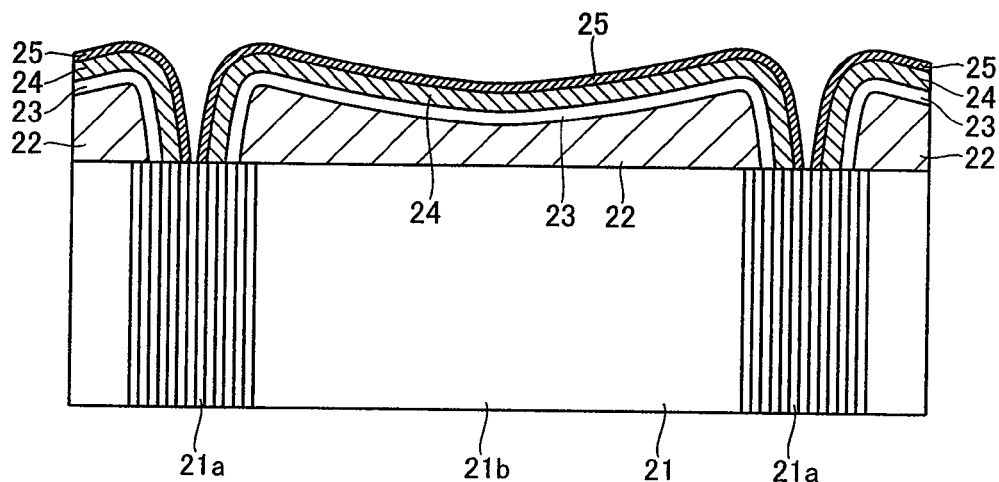

As shown in FIG. 29, the emission layer 23 is grown to cover the n-side cladding layer 22. In order to grow this emission layer 23, the three well layers 23d of InGaN each having the thickness of about 0.003 μm and the three barrier layers 23e of InGaN each having the thickness of about 0.02 μm are alternately grown as shown in FIG. 22 for forming a multilayer film of the MQW structure, thereby forming the active layer 23a constituted of the MQW structure multilayer film formed by the three well layers 23d and the three barrier layers 23e. In order to grow this active layer 23a, the temperature, the gas pressure and the growth rate are set to about 850° C., about 5.74 Pa and about 0.11 nm/s respectively, while the gas flow rates are set to about 75 sccm for TEG, about 230 sccm for TMI and about 8 slm for $NH_3$ respectively. Then, the light guide layer 23b of InGaN having the thickness of about 0.1 μm and the cap layer 23c of AlGaN having the thickness of about 0.02 μm are grown on the active layer 23a of InGaN having the thickness of about 0.07 μm. In order to grow the light guide layer 23b, the temperature, the gas pressure and the growth rate are set to about 860° C., about 5.74 Pa and about 0.11 nm/s respectively, while the gas flow rates are set to about 75 sccm for TEG, about 30 sccm for TMI and about 8 slm for $NH_3$ respectively. In order to grow the cap layer 23c, further, the temperature, the gas pressure and the growth rate are set to about 1100° C., about 5.74 Pa and about 0.32 nm/s respectively, while the gas flow rates are set to about 20 sccm for TMG, about 250 sccm for TMA and about 8 slm for $NH_3$ respectively. Thereafter the p-side cladding layer 24 of AlGaN having a thickness of about 0.4 μm is grown on the surface of the emission layer 23. In order to grow the p-side cladding layer 24, the temperature, the gas pressure and the growth rate are set to about 1100° C., about 5.74 Pa and about 0.35 nm/s respectively, while the gas flow rates are set to about 11 sccm for TMG, about 5 sccm for TMA, about 6 slm for $NH_3$ and about 20 sccm for $Cp_2Mg$ respectively. Thereafter the contact layer 25 of InGaN having the thickness of about 0.003 µm is grown on the surface of the p-side cladding layer 24. In order to grow the contact layer 25, the temperature, the gas pressure and the growth rate are set to about 850° C., about 5.74 Pa and about 0.11 nm/s respectively, while the gas flow rates are set to about 75 sccm for TEG, about 100 sccm for TMI and about 8 slm for $NH_3$ respectively.

Figure 30:
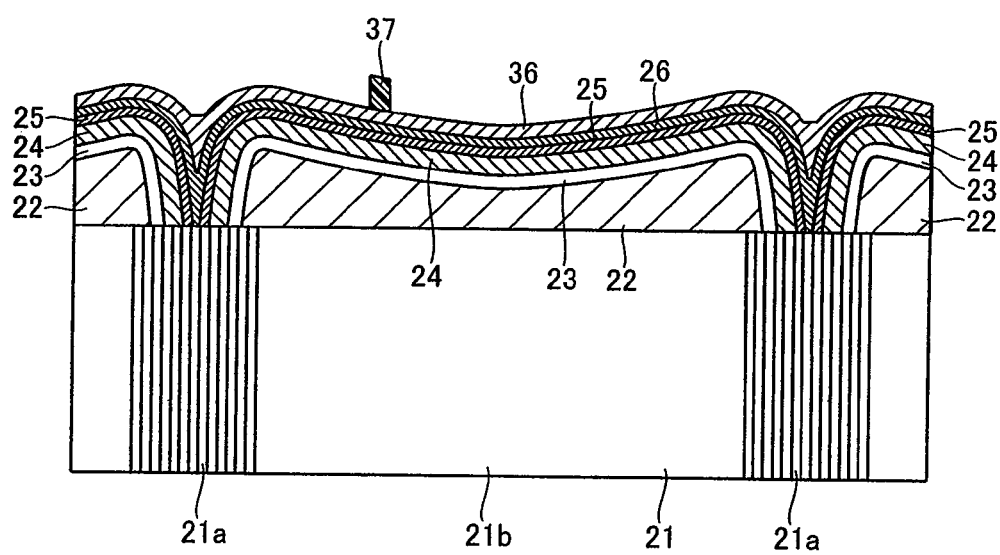

As shown in FIG. 30, the Pt layer (not shown) having the thickness of about 0.001 µm and the Pd layer (not shown) having the thickness of about 0.01 µm are thereafter successively formed on the contact layer 25 by vacuum evaporation or the like, thereby forming the p-side ohmic electrode 26 consisting of the Pt and Pd layers. An $SiO_2$ film 36 having a thickness of about 0.24 µm is formed on the surface of the p-side ohmic electrode 26 by plasma CVD. A striped resist film 37, having a width of about 1.5 µm, extending in the cavity direction is formed on a region (inward beyond the end of one of the defect concentration regions 21a by W6 (about 130 µm)) of the p-side ohmic electrode 26 for forming the ridge portion 35 (see FIG. 21).

Figure 31:
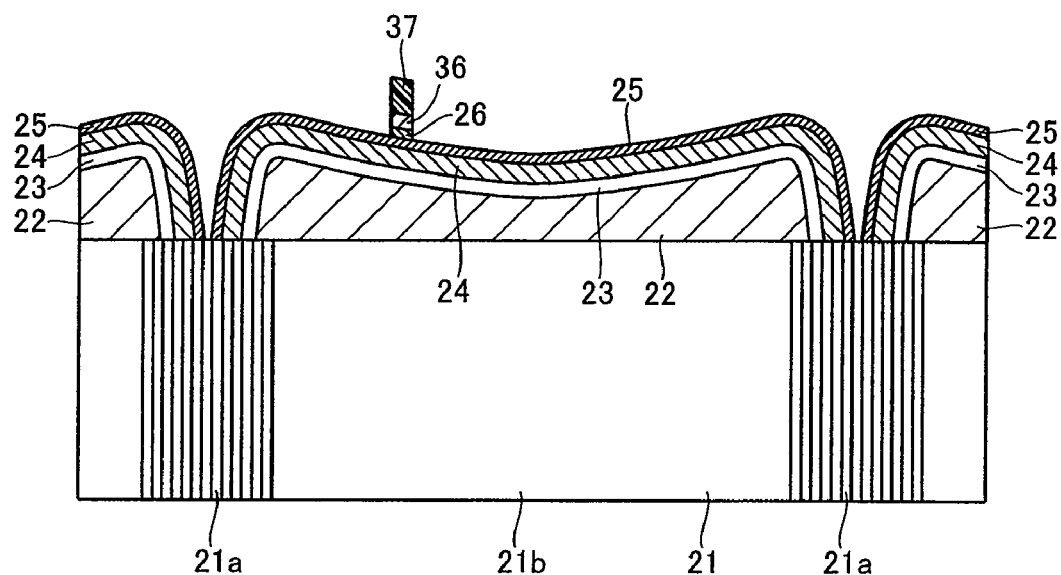

As shown in FIG. 31, prescribed regions of the $SiO_2$ film 36 and the p-side ohmic electrode 26 are removed by RIE with $CF_4$ gas through the resist film 37 serving as a mask. Then, the resist film 37 is removed.

Figure 32:
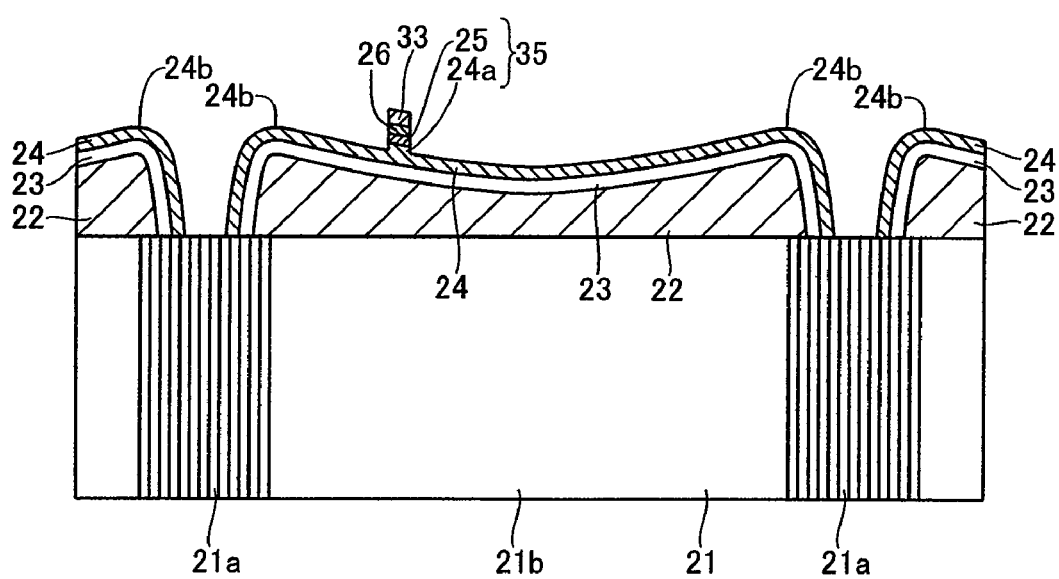

As shown in FIG. 32, prescribed regions between the upper surface of the contact layer 25 and an intermediate portion of the p-side cladding layer 24 (having a depth of about 150 nm from the upper surface of the active layer 23a) are removed by RIE with $Cl_2$ gas through the $SiO_2$ film 36 serving as a mask, thereby forming the ridge portion 35 consisting of the jut portion 24a of the p-side cladding layer 24 and the contact layer 25. Thereafter the $SiO_2$ film 36 is removed.

Figure 33:
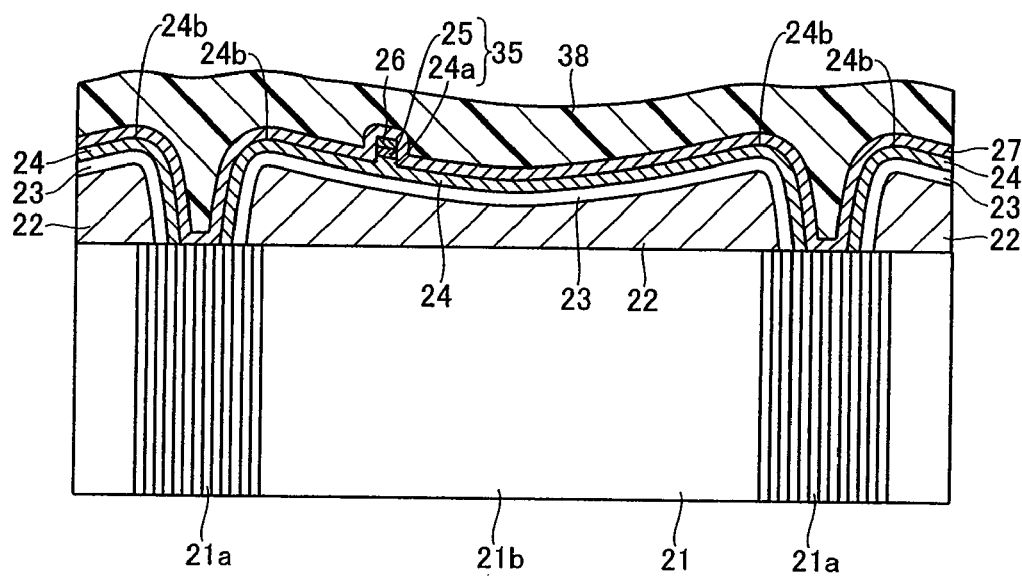
Figure 34:
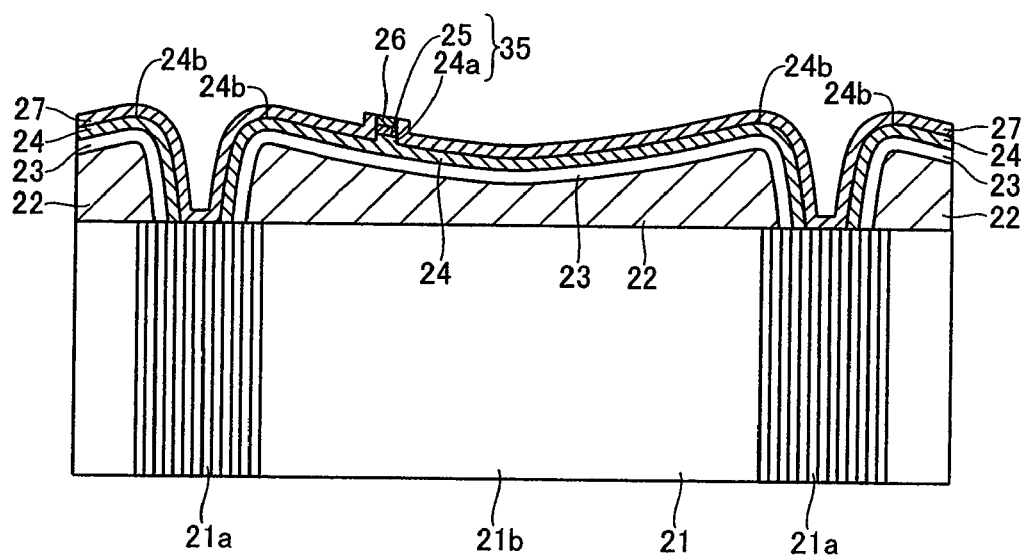

As shown in FIG. 33, the $SiO_2$ film 27 having the thickness of about 0.2 µm is formed by plasma CVD to cover the overall surface. A resist film 38 is applied to cover the $SiO_2$ film 27. Then, the resist film 38 is partially removed by oxygen plasma etching, to expose a portion of the $SiO_2$ film 27 located on the ridge portion 35. Thereafter the portion of the $SiO_2$ film 27 located on the ridge portion 35 is removed by RIE with $CF_4$ gas through the resist film 38 serving as a mask, thereby forming the current blocking layer consisting of the $SiO_2$ film 27 having a shape shown in FIG. 34. Thereafter the resist film 38 is removed.

Figure 35:
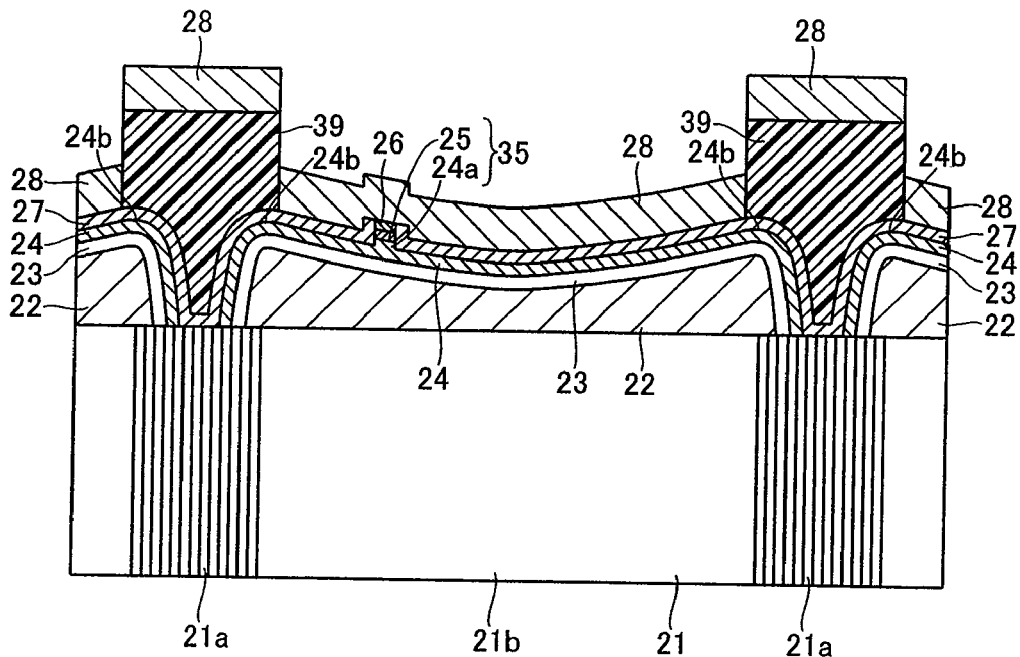
Figure 36:
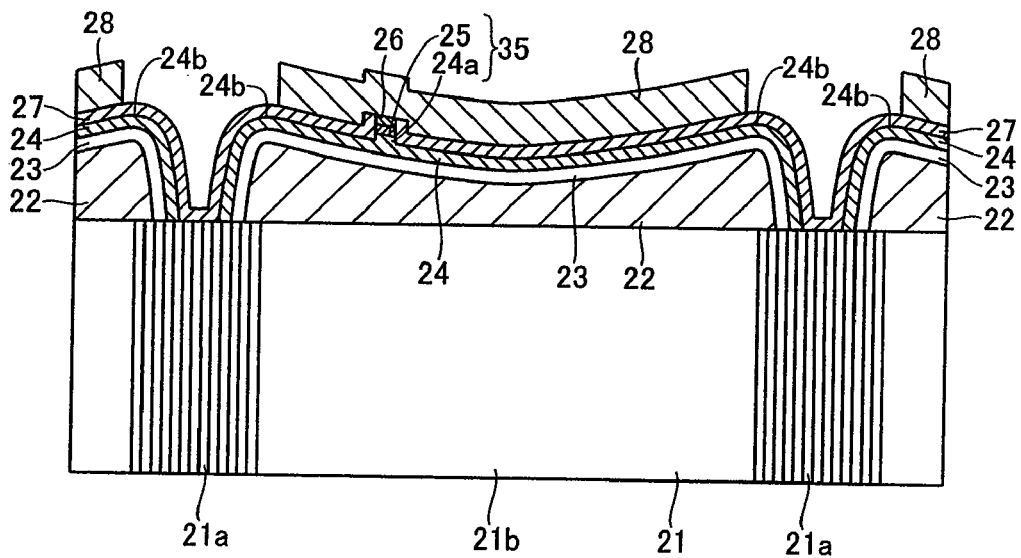

As shown in FIG. 35, resist films 39 are formed on regions other than that for forming the pad electrode 28, and the Ti layer (not shown) having the thickness of about 0.1 µm, the Pd layer (not shown) having the thickness of about 0.2 µm and the Au layer (not shown) having the thickness of about 3 µm are formed in this order by vacuum evaporation or the like, thereby forming the pad electrode 28. Thereafter the resist films 39 are removed, thereby forming the pad electrode 28 constituted of the patterned Ti, Pd and Au layers as shown in FIG. 36. Thereafter the lower surface of the n-type GaN substrate 21 is polished, so that the height H2 (see FIG. 21) of the portion located between the upper surface of the pad electrode 28 and the lower surface of the n-type GaN substrate 21 is about 100 µm.

Figure 37:
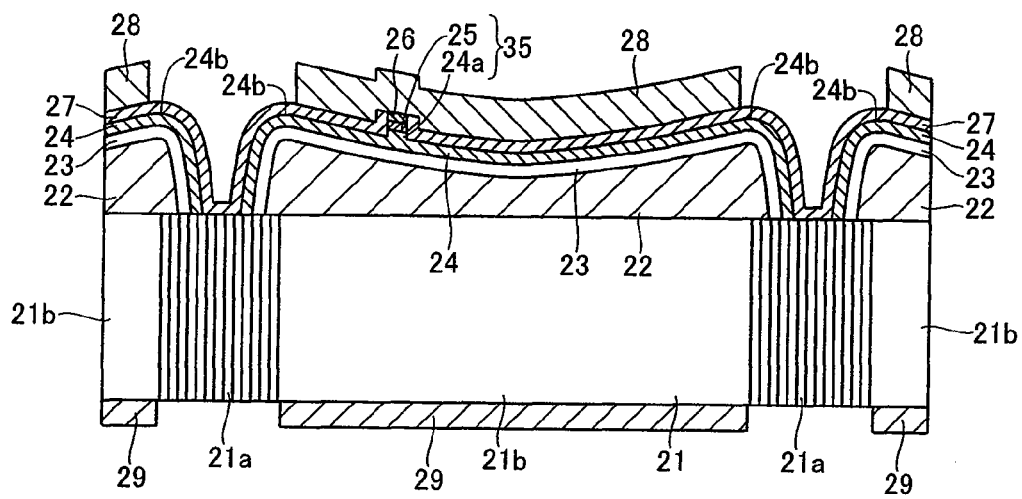

As shown in FIG. 37, the Al layer (not shown) having the thickness of about 0.006 µm, the Pd layer (not shown) having the thickness of about 0.01 µm and the Au layer (not shown) having the thickness of about 0.3 µm are formed in this order on the prescribed region of the back surface of the n-type GaN substrate 21 by vacuum evaporation or the like, thereby forming the n-side ohmic electrode 29 consisting of the Al, Pd and Au layers. The n-type GaN substrate 21 is divided into each device, thereby forming the nitride-based semiconductor laser device according to the second embodiment shown in FIG. 21.

Figure 41:
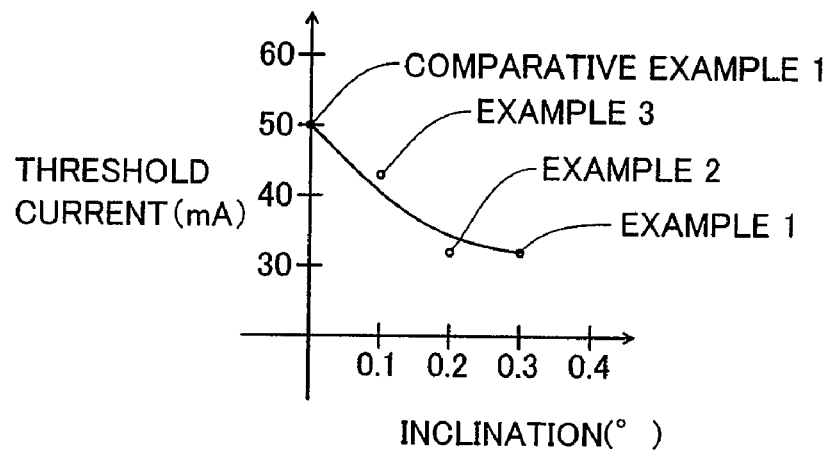
FIGS. 41 to 43 are graphs showing results of confirmatory experiments conducted for confirming effects of the nitride-based semiconductor laser device according to the second embodiment shown in FIG. 21.
Figure 42:
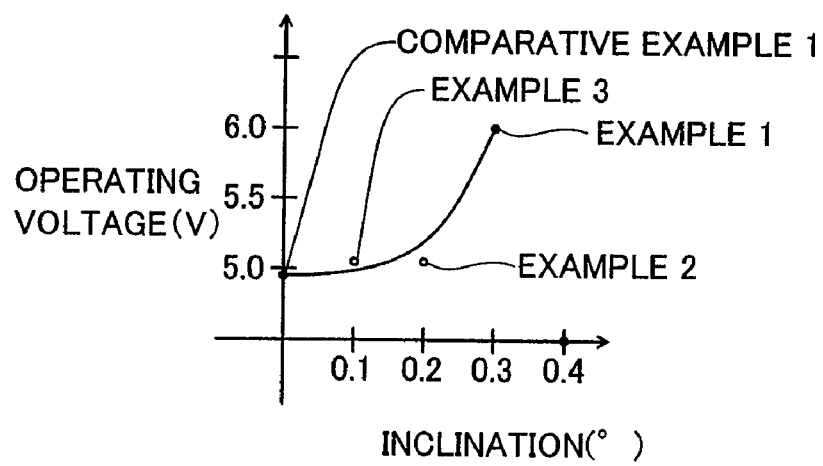

An experiment conducted on Examples 1 to 3 and comparative example 1 for confirming effects of the aforementioned nitride-based semiconductor laser device according to the second embodiment in relation to threshold current and luminous efficiency is now described. In this confirmatory experiment, a nitride-based semiconductor laser device according to Example 1 provided with an n-type GaN substrate 21 having misoriented angles of 0° and 0.3° toward the [1-100] and [11-20] directions respectively, a nitride-based semiconductor laser device according to Example 2 provided with an n-type GaN substrate 21 having misoriented angles of −0.15° and 0.15° toward the [1-100] and [11-20] directions respectively and a nitride-based semiconductor laser device according to Example 3 provided with an n-type GaN substrate 21 having misoriented angles of −0.2° and 0.1° toward the [1-100] and [11-20] directions respectively were prepared in practice through a process similar to that in the aforementioned second embodiment. Further, a nitride-based semiconductor laser device according to comparative example 1 was prepared with an n-type GaN substrate 21 having misoriented angles of −0.3° and 0° toward the [1-100] and [11-20] directions respectively. The structure of the n-type GaN substrate 21 of the nitride-based semiconductor laser device according to comparative example 1 was similar to those of the nitride-based semiconductor laser devices according to Examples 1 to 3 except the aforementioned misoriented angles. Then, inclinations of the principal surfaces (upper surfaces) of n-side cladding layers 22, threshold currents and operating currents in operation at 60 mA were measured in the aforementioned nitride-based semiconductor laser devices according to Examples 1 to 3 and comparative example 1. In each nitride-based semiconductor laser device, the inclination of the principal surface (upper surface) of the n-side cladding layer 22 was measured on the upper surface of a portion of the n-side cladding layer 22 inward beyond the end of a defect concentration region 21a by about 130 µm with respect to the principal surface (upper surface) of the n-type GaN substrate 21. Table 1 and FIGS. 41 and 42 show the results of this experiment respectively.

TABLE 1

| | Misoriented angle (°) toward [1-100] Direction | Misoriented angle (°) toward [11-20] Direction | Inclination(°) |
| --- | --- | --- | --- |
| Example 1 | 0 | 0.3 | 0.3 |
| Example 2 | −0.15 | 0.15 | 0.2 |
| Example 3 | −0.2 | 0.1 | 0.1 |
| Comparative Example 1 | −0.3 | 0 | 0 |

Referring to Table 1, it has been proved that the inclination of the upper surface of the n-side cladding layer 22 approaches 0° as the absolute value of the misoriented angle of the n-type GaN substrate 21 toward the [1-100] direction is increased. More specifically, the inclination of the upper surface of the n-side cladding layer 22 was about 0.3° in the nitride-based semiconductor laser device according to Example 1 provided with the n-type GaN substrate 21 having the misoriented angles of 0° and 0.3° toward the [1-100] and [11-20] directions respectively. The inclination of the upper surface of the n-side cladding layer 22 was about 0.2° in the nitride-based semiconductor laser device according to Example 2 provided with the n-type GaN substrate 21 having the misoriented angles of −0.15° and 0.15° toward the [1-100] and [11-20] directions respectively. Further, the inclination of the upper surface of the n-side cladding layer 22 was about 0.1° in the nitride-based semiconductor laser device according to Example 3 provided with the n-type GaN substrate 21 having the misoriented angles of −0.2° and 0.1° toward the [1-100] and [11-20] directions respectively. In the nitride-based semiconductor laser device according to comparative example 1 provided with the n-type GaN substrate 21 having the misoriented angles of −0.3° and 0° toward the [1-100] and [11-20] directions respectively, on the other hand, the inclination of the upper surface of the n-side cladding layer 22 was about 0°.

Referring to FIG. 41, it has also been proved that the threshold current is reduced and the luminous efficiency is improved as the inclination of the upper surface of the n-side cladding layer 22 is increased. More specifically, the threshold current of the nitride-based semiconductor laser device according to Example 1 having the inclination of 0.3° was about 32 mA. The threshold current of the nitride-based semiconductor laser device according to Example 2 having the inclination of 0.2° was about 32 mA. Further, the threshold current of the nitride-based semiconductor laser device according to Example 3 having the inclination of 0.1° was about 43 mA. On the other hand, the threshold current of the nitride-based semiconductor laser device according to comparative example 1 having the inclination of 0° was about 50 mA. As the inclination is increased, a growth component of the n-side cladding layer 22 in a direction parallel to the surface of the n-type GaN substrate 21 is so increased as to increase a propagation component for defects 22b in the direction parallel to the surface of the n-type GaN substrate 21. Thus, the defects 22b so easily disappear as to reduce the number of nonradiative centers formed by the defects 22b. The threshold current is conceivably reduced as a result. The threshold current is remarkably increased when the inclination is around 0°, and hence the inclination is preferably increased. Therefore, the absolute value of the misoriented angle toward the [1-100] direction is preferably reduced, and the misoriented angle toward the [1-100] direction is preferably −0.25° to 0.25° from the results of the aforementioned Table 1.

Referring to FIG. 42, it has further been proved that the operating voltage is increased as the inclination of the upper surface of the n-side cladding layer 22 is increased. More specifically, the operating voltage was about 6.0 V in the nitride-based semiconductor laser device according to Example 1 having the inclination of 0.3° on the upper surface of the n-side cladding layer 22. The operating voltage was about 5.1 V in the nitride-based semiconductor laser device according to Example 2 having the inclination of 0.2° on the upper surface of the n-side cladding layer 22. Further, the operating voltage was about 5.1 V in the nitride-based semiconductor laser device according to Example 3 having the inclination of 0.1° on the upper surface of the n-side cladding layer 22. On the other hand, the operating voltage was about 4.9 V in the nitride-based semiconductor laser device according to comparative example 1 having the inclination of 0° on the upper surface of the n-side cladding layer 22. The operating voltage is increased as the inclination of the upper surface of the n-side cladding layer 22 is increased, and hence the inclination is preferably optimized with the threshold current and the operating voltage.

When employing an n-type GaN substrate 21 having defect concentration regions 21a formed to extend in a direction along the [1-100] direction, a propagation component for defects 22b in a direction parallel to the surface of the n-type GaN substrate 21 is increased and defects 22b on the surface of an n-side cladding layer 22 easily disappear as compared with a case of employing an n-type GaN substrate 21 having defect concentration regions 21a formed to extend in a direction along the [11-20] direction. Therefore, an n-type GaN substrate 21 having defect concentration regions 21a formed to extend in a direction along the [1-100] direction is preferably employed.

In another experiment conducted independently of the aforementioned experiment, an inclination was reduced and the principal surface of an n-side cladding layer 22 was hardly concaved when a misoriented angle θ toward the [11-20] direction of an n-type GaN substrate 21 was around 0° (−0.05<θ<0.05). Further, a tendency to nonuniform formation of protuberances was observed on the principal surface of the n-side cladding layer 22. In this case, an emission layer 23 formed on the principal surface of the n-side cladding layer 22 is also unevenly formed along the protuberances, and hence light in the emission layer 23 easily outgoes from the upper and lower surfaces of the emission layer 23. Thus, a light confinement effect is reduced to reduce luminous efficiency. Therefore, the misoriented angle toward the [11-20] direction of the n-type GaN substrate 21 is preferably set to not more than −0.05° or at least 0.05°.

Figure 43:
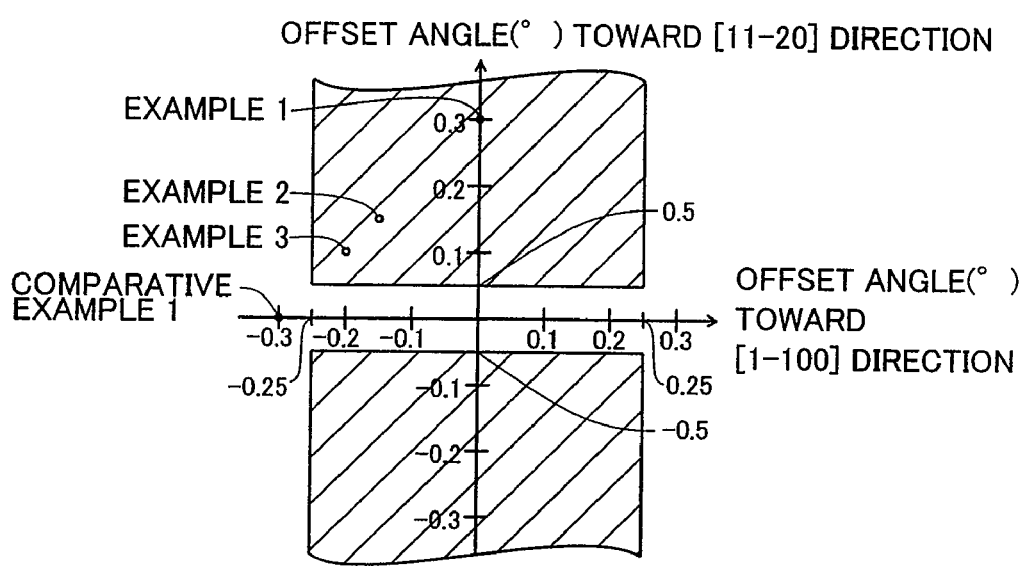

In consideration of the aforementioned results, the misoriented angles toward the [1-100] and [11-20] directions of the n-type GaN substrate 21 are preferably in ranges shown by slant lines in FIG. 43 respectively. In other words, the misoriented angle toward the [1-100] direction of the n-type GaN substrate 21 is preferably set to at least −0.25° and not more than 0.25°, while that toward the [11-20] direction of the n-type GaN substrate 21 is preferably set to not more than −0.05° or at least 0.05°.

Although the present invention has been described and illustrated in detail, it is clearly understood that the same is by way of illustration and example only and is not to be taken by way of limitation, the spirit and scope of the present invention being limited only by the terms of the appended claims.

For example, while a nitride-based semiconductor substrate (n-type GaN substrate) is employed as the semiconductor substrate in each of the aforementioned embodiments, the present invention is not restricted to this but a semiconductor substrate other than the nitride-based semiconductor substrate may alternatively be employed.

While the nitride-based semiconductor laser device is provided with two growth inhibiting portions holding an element forming region thereof in each of the aforementioned embodiments, the present invention is not restricted to this but only a single growth inhibiting portion may alternatively be provided on a region other than the element forming region of the nitride-based semiconductor laser device. Referring to FIG. 37, for example, a nitride-based semiconductor laser device having a width of about 200 μm may be formed by forming another ridge portion identical to the ridge portion 35 on a portion inward beyond the other defect concentration region 21a by about 160 μm in addition to the ridge portion 35 and thereafter dividing the n-type GaN substrate 21 into each device along the central portions of the defect concentration regions 21a and the low defect density region 21b.

While the n-side cladding layer included in the semiconductor element layers is concavely formed in each of the aforementioned embodiments, the present invention is not restricted to this but the n-side cladding layer may alternatively be so formed as to have an inclined upper surface (principal surface) of a shape other than the concave shape. Further alternatively, a semiconductor element layer other than the n-side cladding layer may be so formed as to have an inclined upper surface (principal surface).

What is claimed is:

1. A method of fabricating a semiconductor laser device, comprising steps of:
preparing a semiconductor substrate provided with plural growth inhibiting portions including defect concentration regions on prescribed regions of the principal surface;
growing a semiconductor element layer having a principal surface inclined with respect to the principal surface of said semiconductor substrate and including an emission layer on the principal surface of said semiconductor substrate through said growth inhibiting portions; and
forming a projection portion functioning as a current path toward said emission layer on said principal surface of said semiconductor element layer,
wherein said projection portion is formed on a noncentral portion between said growth inhibiting portions,
said step of preparing said semiconductor substrate includes a step of preparing said semiconductor substrate on which a first growth inhibiting portion and a second growth inhibiting portion of said growth inhibiting portions are arranged at a prescribed interval, and
said step of growing said semiconductor element layer includes a step of growing said semiconductor element layer having a concave principal surface between said first growth inhibiting portion and said second growth inhibiting portion.

2. The method of fabricating a semiconductor laser device according to claim 1, wherein said step of preparing said semiconductor substrate includes a step of preparing said semiconductor substrate in which the surface of said defect concentration region is terminated with nitrogen.

3. The method of fabricating a semiconductor laser device according to claim 1, wherein
said step of preparing said semiconductor substrate includes a step of preparing said semiconductor substrate including said growth inhibiting portion so provided as to extend along the <1-100> direction of said semiconductor substrate.

4. The method of fabricating a semiconductor laser device according to claim 1, further comprising a step of forming a projection portion functioning as a current path toward said emission layer on an inclined region of said principal surface of said semiconductor element layer.

5. The method of fabricating a semiconductor laser device according to claim 1, further comprising a step of forming the top of a projection portion functioning as a current path toward said emission layer on a position lower than the top of said semiconductor element layer.

6. The method of fabricating a semiconductor laser device according to claim 1, wherein
the misoriented angle of said semiconductor substrate toward the <11-20> direction is not more than –0.05° or at lease 0.05°.

7. A method of fabricating a semiconductor laser device, comprising steps of:
preparing a semiconductor substrate provided with plural growth inhibiting portions including defect concentration regions on prescribed regions of the principal surface;
growing a semiconductor element layer having a principal surface inclined with respect to the principal surface of said semiconductor substrate and including an emission layer on the principal surface of said semiconductor substrate through said growth inhibiting portions;
forming a projection portion functioning as a current path toward said emission layer on said principal surface of said semiconductor element layer; and
dividing said semiconductor substrate into each device,
wherein said projection portion is formed on a non-central portion between said growth inhibiting portions,
said semiconductor substrate has a low defect density region arranged between said growth inhibiting portions, and
said step of dividing said semiconductor substrate includes steps of:
dividing said semiconductor substrate along said growth inhibiting portions, and
dividing said semiconductor substrate along said low defect density region.

8. The method of fabricating a semiconductor laser device according to claim 7, wherein said step of preparing said semiconductor substrate includes a step of preparing said semiconductor substrate in which the surface of said defect concentration region is terminated with nitrogen.

9. The method of fabricating a semiconductor laser device according to claim 7, wherein
said step of preparing said semiconductor substrate includes a step of preparing said semiconductor substrate including said growth inhibiting portion so provided as to extend along the <1-100> direction of said semiconductor substrate.

10. The method of fabricating a semiconductor laser device according to claim 7, further comprising a step of forming a projection portion functioning as a current path toward said emission layer on an inclined region of said principal surface of said semiconductor element layer.

11. The method of fabricating a semiconductor laser device according to claim 7, further comprising a step of forming the top of a projection portion functioning as a current path toward said emission layer on a position lower than the top of said semiconductor element layer.

12. The method of fabricating a semiconductor laser device according to claim 7, wherein
the misoriented angle of said semiconductor substrate toward the <11-20> direction is not more than –0.05° or at lease 0.05°.

13. The method of fabricating a semiconductor laser device according to claim 7, wherein said each device has only a single growth inhibiting portion among said plural growth inhibiting portions.

* * * * *